United States Patent
Baran et al.

(10) Patent No.: US 6,603,486 B1
(45) Date of Patent: Aug. 5, 2003

(54) ELECTRONIC DRAWING DATA TRANSLATION

(75) Inventors: Ilya Baran, Newton, MA (US); Christopher Ryan, Windham, NH (US); Ricardo Chin, Shrewsbury, MA (US)

(73) Assignee: SolidWorks Corporation, Concord, MA (US)

( * ) Notice: Subject to any disclaimer, the term of this patent is extended or adjusted under 35 U.S.C. 154(b) by 0 days.

(21) Appl. No.: 09/449,137

(22) Filed: Nov. 24, 1999

Related U.S. Application Data

(63) Continuation-in-part of application No. 09/394,824, filed on Sep. 13, 1999.

(51) Int. Cl.[7] .................................................. G09G 5/00
(52) U.S. Cl. .................... 345/672; 345/440; 345/619; 345/629; 345/441
(58) Field of Search ................................ 345/427, 440, 345/636, 629, 441, 419, 672, 673, 680, 443, 619

(56) References Cited

U.S. PATENT DOCUMENTS

| | | | | |
|---|---|---|---|---|
| 5,297,241 A | * | 3/1994 | Hirr, Jr. et al. | |
| 5,701,403 A | * | 12/1997 | Watanabe et al. | |
| 5,808,616 A | * | 9/1998 | Shimizu | 345/419 |
| 5,852,442 A | * | 12/1998 | Morito | |
| 5,912,674 A | * | 6/1999 | Magarshak | |
| 5,990,897 A | * | 11/1999 | Hanratty | 345/420 |

OTHER PUBLICATIONS

Foley, VanDam, Feiner, Hughes, "Computer Graphics Principles and Practice", Addison–Wesley, NY, NY, Ch. 5.
Maron, Ran, "Graham's Scan Algorithm for Finding the Convex Hull", Ran Maron's web site, <http://www.math.tau.ac.il/~maron/ex2/ex2.html>, Jun. 2000.

* cited by examiner

Primary Examiner—Mark Zimmerman
Assistant Examiner—Kimbinh T. Nguyen
(74) Attorney, Agent, or Firm—James V. Mahon; Clifford Chance US LLP

(57) ABSTRACT

Processing data objects of a two-dimensional drawing includes marking data objects corresponding to annotation, separating the drawing into a plurality of views, and associating each of the data objects corresponding to annotation with one of the views. Separating the drawing into a plurality of views may include constructing a plurality of intersection and proximity graphs and using the graphs to provide a plurality of connected sets, where each set may correspond to one of the views. The border views may be identified by determining which of the views include less than a predetermined number of elements, contain at least two other views, and are not contained in other views.

17 Claims, 29 Drawing Sheets

ELECTRONIC DRAWING DATA TRANSLATION

CROSS-REFERENCE TO RELATED APPLICATIONS

This application is a continuation-in-part of U.S. patent application Ser. No. 09/394,824 (pending) filed on Sep. 13, 1999.

BACKGROUND OF THE INVENTION

1. Field of the Invention

This application relates to the field of computer aided design and more particularly to the field of computer modeling.

2. Description of Related Art

Computer-aided design software can be used to construct and manipulate computer drawings of objects referred to as "models". The user is presented with a display of the model on the computer screen and manipulates the model using keyboard commands, a mouse/cursor combination, and other various input means. Changes to the model are reflected in the screen display of the model as the user makes the changes or, alternatively, in response to the user issuing a specific command to update the screen display of the model. In either case, the screen display of the model serves as the main source of model information to the user and as the user's reference for inputting and changing features of the model.

Although computer-aided design based on three dimensional models has become increasingly prevalent, engineers and other designers continue to use conventional two-dimensional design drawings in many cases. Two-dimensional design drawings present a number of difficulties, one of which is that they are very difficult to read, even to experts. As two-dimensional renderings of different views of three dimensional objects, the drawings necessarily separate relevant information about a unified object into a plurality of different views. This separation requires the user to understand the multiple views, rather than looking at the object as a whole. In addition, some views, such as section cuts, may not match any view that would actually be seen by a viewer of a real object, so that they require substantial imagination on the part of the user. As the complexity of a modeled object increases and as the number of views increases, it can be very difficult to keep track of the relationship of different views and of the relationship of different components within different views.

Despite these problems, two-dimensional drawings remain a standard modeling technique for a wide range of objects in many fields. Accordingly, a need exists for simplifying computer modeling of two-dimensional drawings.

SUMMARY OF THE INVENTION

According to the present invention, processing data objects of a two-dimensional drawing includes marking data objects corresponding to annotation, separating the drawing into a plurality of views, and associating each of the data objects corresponding to annotation with one of the views. Separating the drawing into a plurality of views may include constructing a plurality of intersection and proximity graphs and using the graphs to provide a plurality of connected sets, where each set may correspond to one of the views. The border views may be identified by determining which of the views include less than a predetermined number of elements, contain at least two other views, and are not contained in other views.

Marking data objects corresponding to annotation may include identifying arrows, section lines, detail circles, and text. Identifying arrows may include detecting three lines that form a triangle and three-sided polygons. Isosceles triangles and three-sided polygons corresponding to isosceles triangles may be identified arrows if the a side having a different length than two other sides is shorter than the two other sides. Prior to marking data objects corresponding to annotation, degenerate objects may be removed.

DETAILED DESCRIPTION OF THE PREFERRED EMBODIMENT(S)

Figure 1:
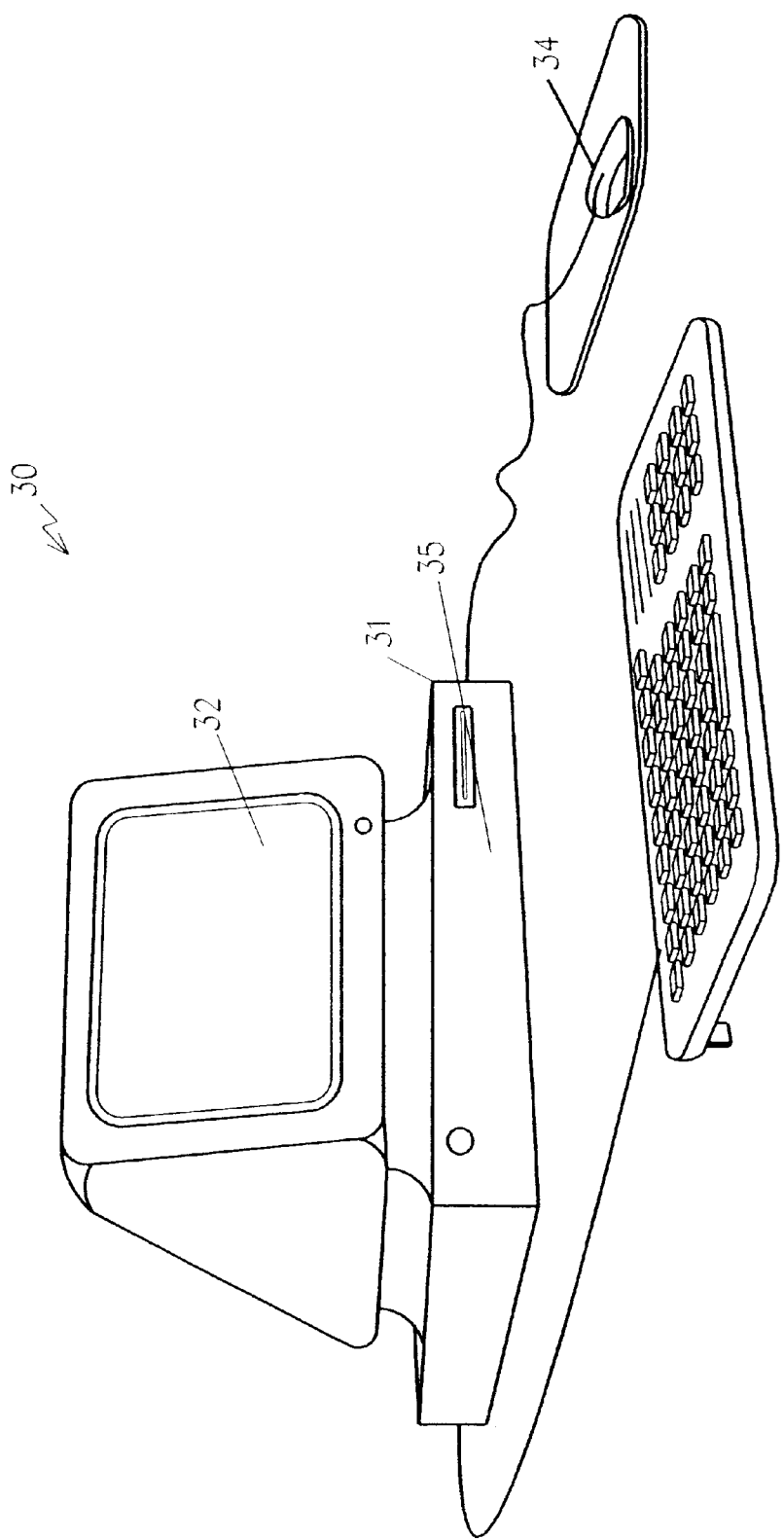
FIG. 1 depicts the system components of a computer modeling system.

Referring to FIG. 1, a computerized modeling system 30 includes a CPU 31, a computer screen 32, a keyboard input device 33, a mouse input device 34, and a storage device 35. The CPU 31, computer screen 32, keyboard 33, mouse 34, and storage device 35 are conventional, commonly available, computer hardware devices such as a workstation or personal computer employing a microprocessor, such as a Pentium- or Pentium-II based processor or other conventional processor. The mouse 34 has conventional, user-actuatable, left and right buttons. Other appropriate computer hardware platforms are suitable as will become apparent from the discussion which follows. Such computer hardware platforms are preferably capable of operating a software operating system capable of a graphical user interface, such as the Microsoft Windows NT, Windows 95, or Windows 98 operating systems, or a MacIntosh operating system from Apple Computer.

Computer-aided design software is stored on the storage device 35 and is loaded into and executed by the CPU 31. The software allows the user to create and modify a model of an object.

Figure 2:
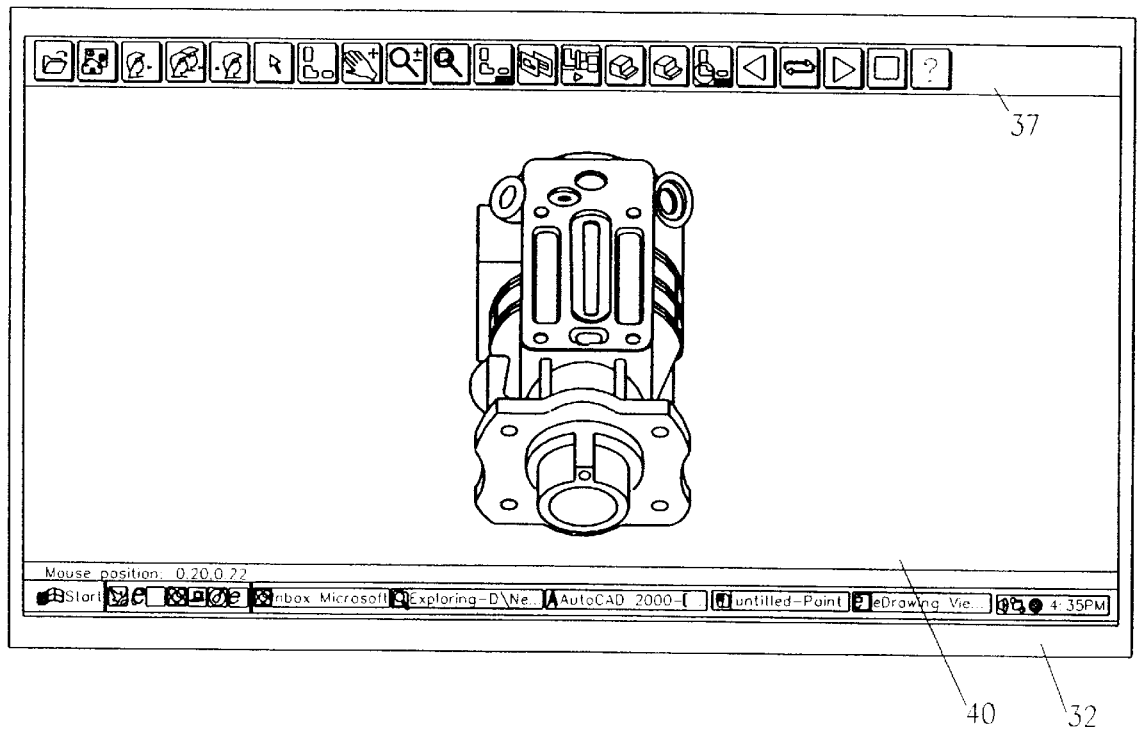
FIG. 2 depicts a computer screen with a modeling window for displaying an object to be viewed.

Referring to FIG. 2, the CPU 31 uses the computer screen 32 to display a three-dimensional model in a modeling window 40. The object depicted in FIG. 2 is a three-dimensional rendering of a common mechanical object, the housing 37 for a pump. Other aspects thereof are described in more detail below.

Referring again to FIG. 1, a user actuates the keyboard 33 and the mouse 34 to enter and modify data for the model. The CPU 31 accepts and processes input from the keyboard 33 and the mouse 34. Using the modeling software, the CPU 31 processes the input along with the data associated with the model and makes corresponding and appropriate changes to the display on the computer screen 32. In addition, data corresponding to the model created by the user can be written from the CPU 31 to the storage device 35. It will be appreciated by those of ordinary skill in the art that the invention could be used in conjunction with any computer-aided design software, including software used to generate three dimensional or two-dimensional models, such as modeling software provided by SolidWorks Corporation of Concord, Massachusetts.

Figure 3:
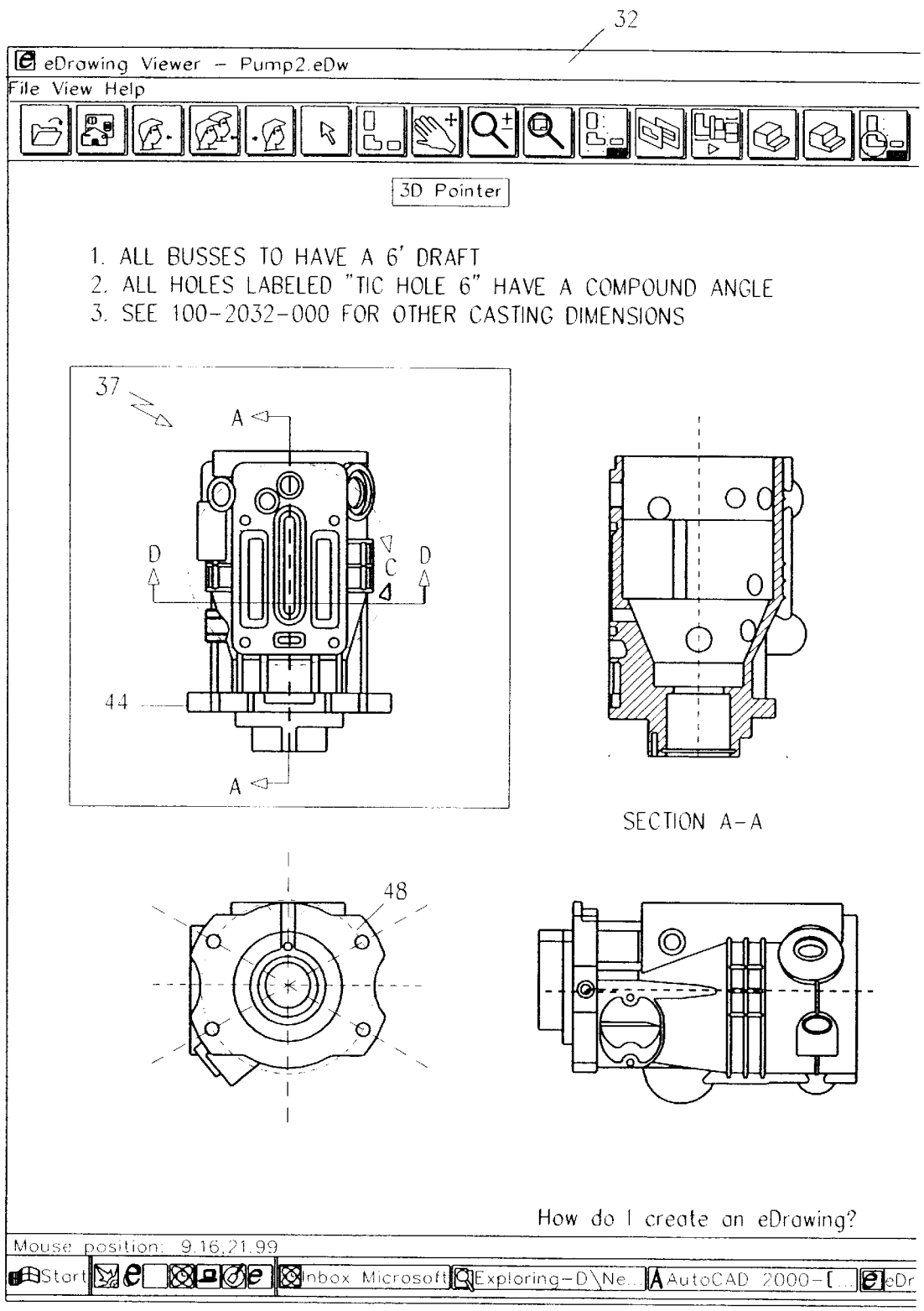
FIGS. 3 and 4 depict a plurality of views of an example of a design drawing in a modeling window of a computer system such as that of FIG. 1.
Figure 4:
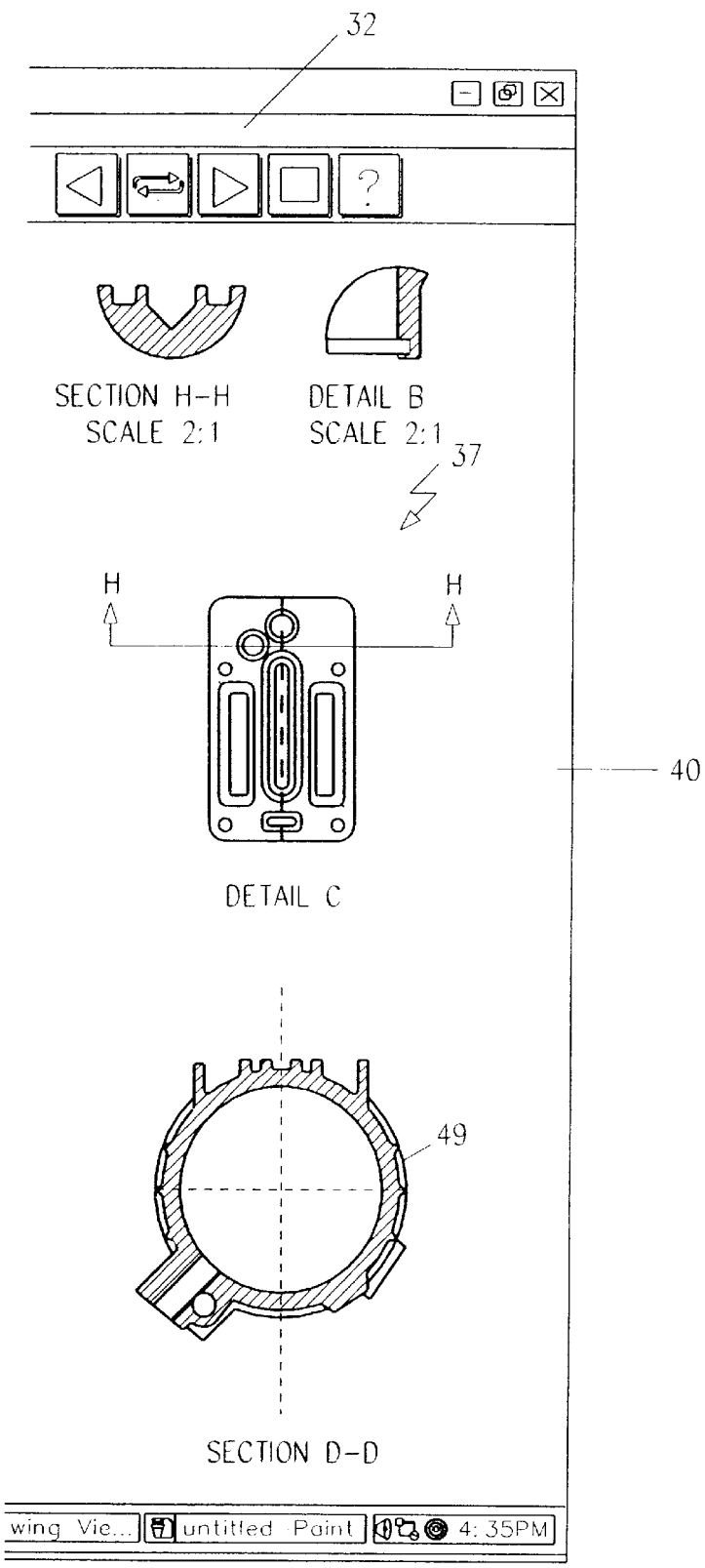

Referring to FIGS. 3 and 4, a two-dimensional design drawing is depicted, showing a number of two-dimensional views of, in this example, the pump housing 37 of FIG. 2. The computer screen 32 includes the modeling window 40 that contains a number of views of the pump housing 37. Different views include a front view 44, a top view 48, a number of section views, and a detail view. As can be observed from the drawing of FIGS. 3 and 4, a drawing even for a simple mechanical device such as a pump housing is very complex, making it quite difficult to read. For example, the level of detail requires that the model be sufficiently large to read the dimensional data, but the number of views makes it difficult to fit all views of a sufficiently large size on a single screen. As a result, the computer screen 32 typically only shows part of the modeling window 40 at any given time, requiring the user to use a process, such as an arrow bar or other conventional device (not shown) to move about the modeling window 40 among the different views.

Figure 5:
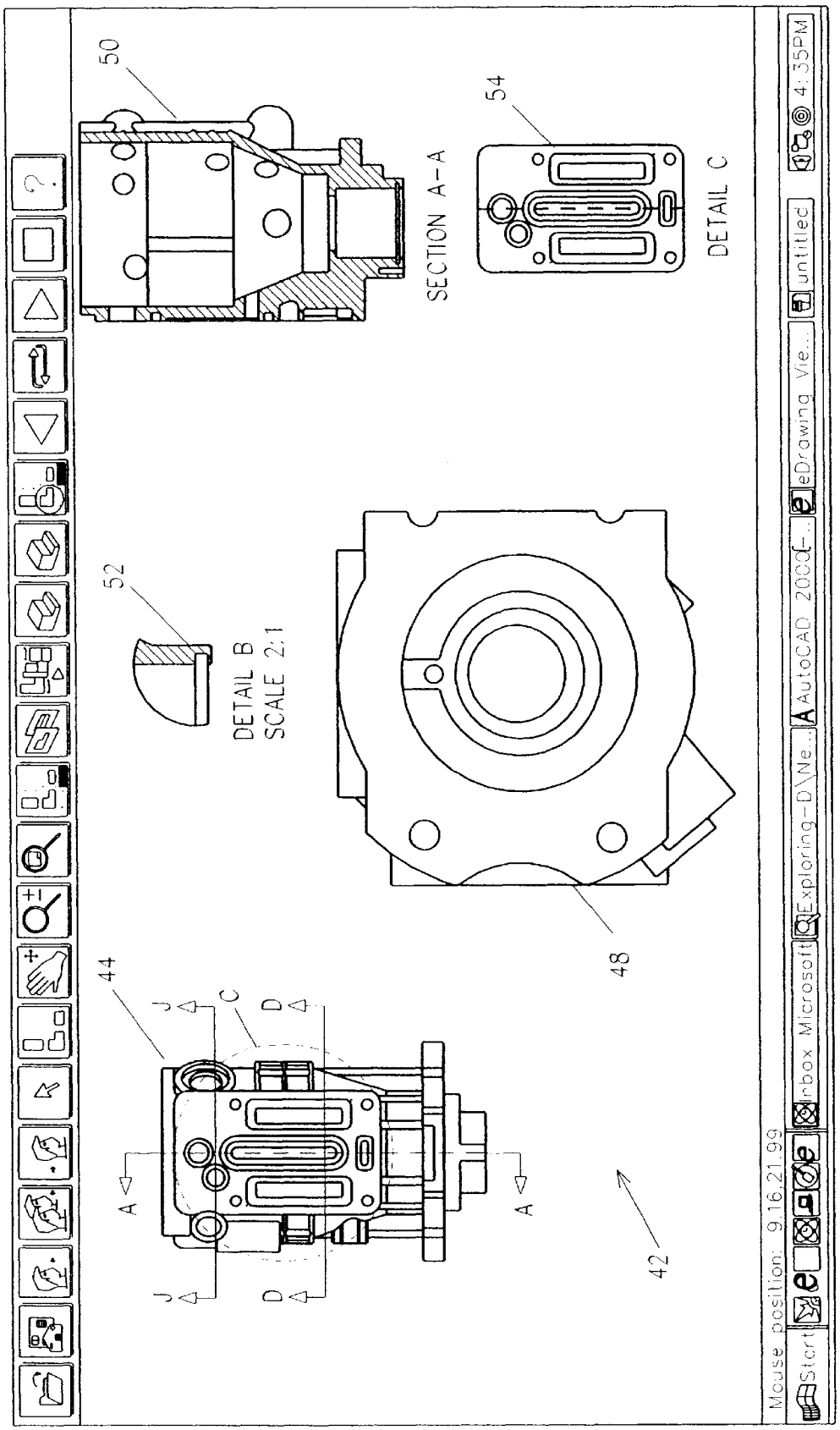
FIG. 5 depicts a simplified schematic of a design drawing in the modeling window of a computer screen.

A simplified schematic of typical design drawings, such as those of FIGS. 3 and 4, is depicted in FIG. 5, containing a reduced level of design detail as needed to illustrate the methods and systems disclosed herein. In FIG. 5 certain shading and background elements have been included that would not necessarily appear on the computer screen 32, but that enhance the ability to view elements discussed below.

Referring to FIG. 5, in one embodiment, a model 42 consists of a plurality of two-dimensional views of a pump housing object, such as the front view 44, the top view 48, a section view 50, a first detail view 52 and a second detail view 54. Section view 50 is a two-dimensional view of a cross section that one would obtain by cutting the object depicted in front view 44 along the line A—A that is depicted in the front view 44. It should be noted that a side view can be obtained by taking a section view while placing the section line adjacent to, rather than through, an object to be viewed. Top view 48 depicts the view that one would obtain by looking at the top of the object depicted in the front view 44, with the top of the object being positioned at the top of the computer screen 32. Detail view 52 is a depiction of a more detailed element B as indicated in the section view 50. Detail view 54 is a more detailed view of the circled item C of the front view 44.

Figure 6:
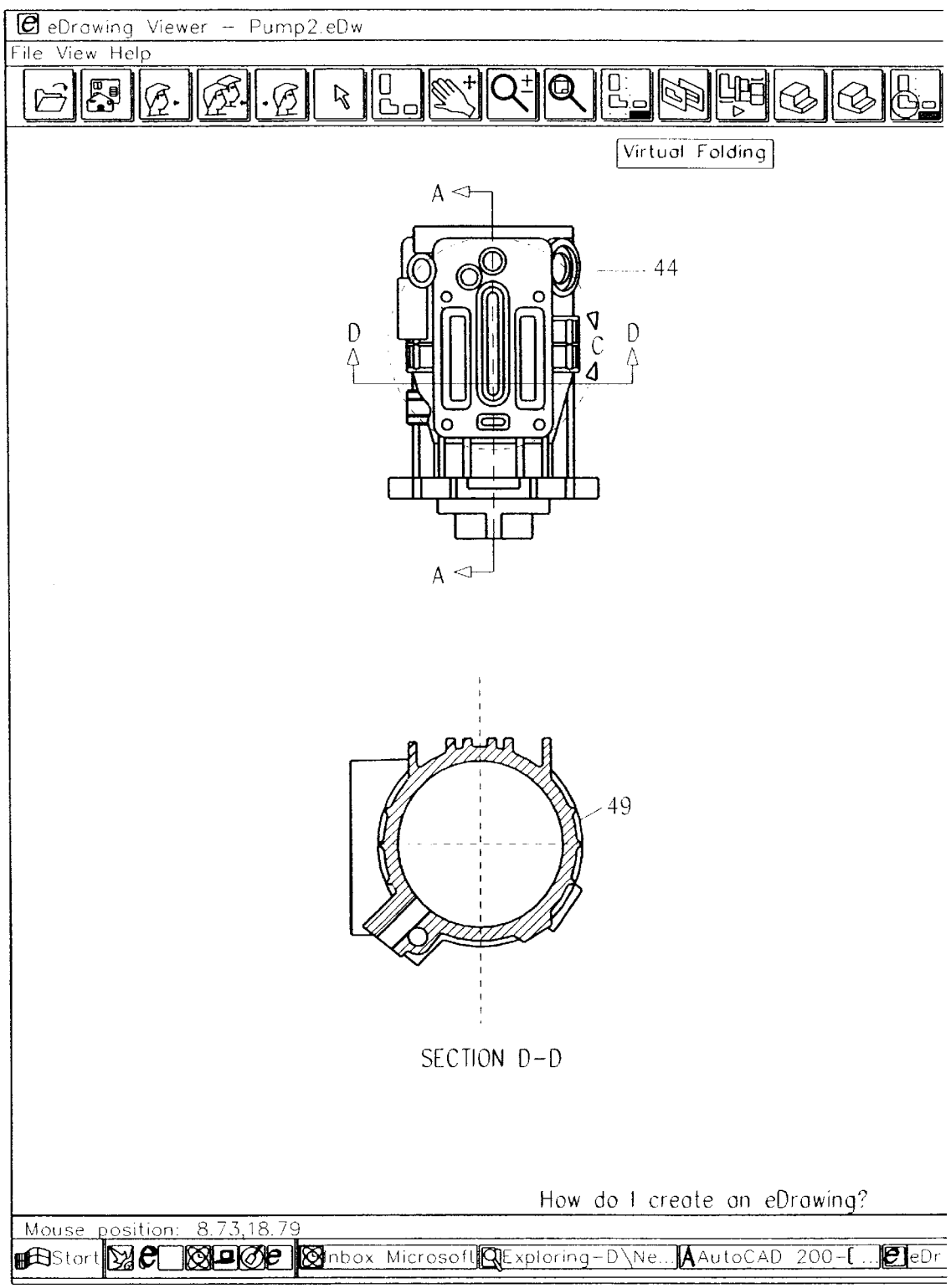
FIG. 6 depicts the front view of FIG. 3 and a section view of FIG. 4 after completion of a virtual folding process of the present systems and methods.

Provided herein is a computer-based system for providing improved viewing of a two-dimensional electronic drawing having a plurality of views. Referring to FIGS. 3, 4 and 6, the computer-based system includes a virtual folding process for permitting a viewer to place selected views from a plurality of possible views in proximity to each other on the computer screen. FIG. 3 depicts a schematic of a model 42 with the front view 44 in the computer screen 32. FIG. 4 depicts section view D—D, which is a section that would result upon cutting the pump housing 37 along axis D—D. Thus, while the front view 44 and the section view 49 are in the same computer screen 32, they are sufficiently distant from each other that it is difficult to view both of them on the computer screen 32 at the same time while maintaining a sufficiently close view to see important details, such as dimensional data.

The situation depicted in FIGS. 3 and 4 is analogous to a situation that arises with two-dimensional drawings in paper form, such as those used by architects or mechanical engineers. Different views are often located far apart on the paper, so that it is difficult to examine two related views at the same time. The conventional method for handling a large paper drawing is to fold the drawing so that items of interest are in close proximity to each other, with other items hidden by the fold in the drawing.

The methods and systems disclosed herein provide a virtual folding process that permits the user to place selected views near each other on the screen, while hiding views that are not selected. Thus, the virtual folding process permits the user to select the front view 44 and the section view 49, and to move the two views into proximity to each other, as depicted in FIG. 6. Execution of a virtual folding process may be executed by any conventional mechanism, such as a pull down menu, an icon, a mouse operation, or the like. For example, a user might select a virtual folding process from a library of tools by clicking on a tools menu bar at the top of the computer screen 32. The user could then select views among those on the computer screen 32 by locating the cursor arrow on a particular view and clicking one of the buttons of the mouse. Alternatively, the virtual folding process could involve dragging and dropping a selected view into closer proximity with another view. Further details as to the virtual folding process are provided below.

Figure 7:
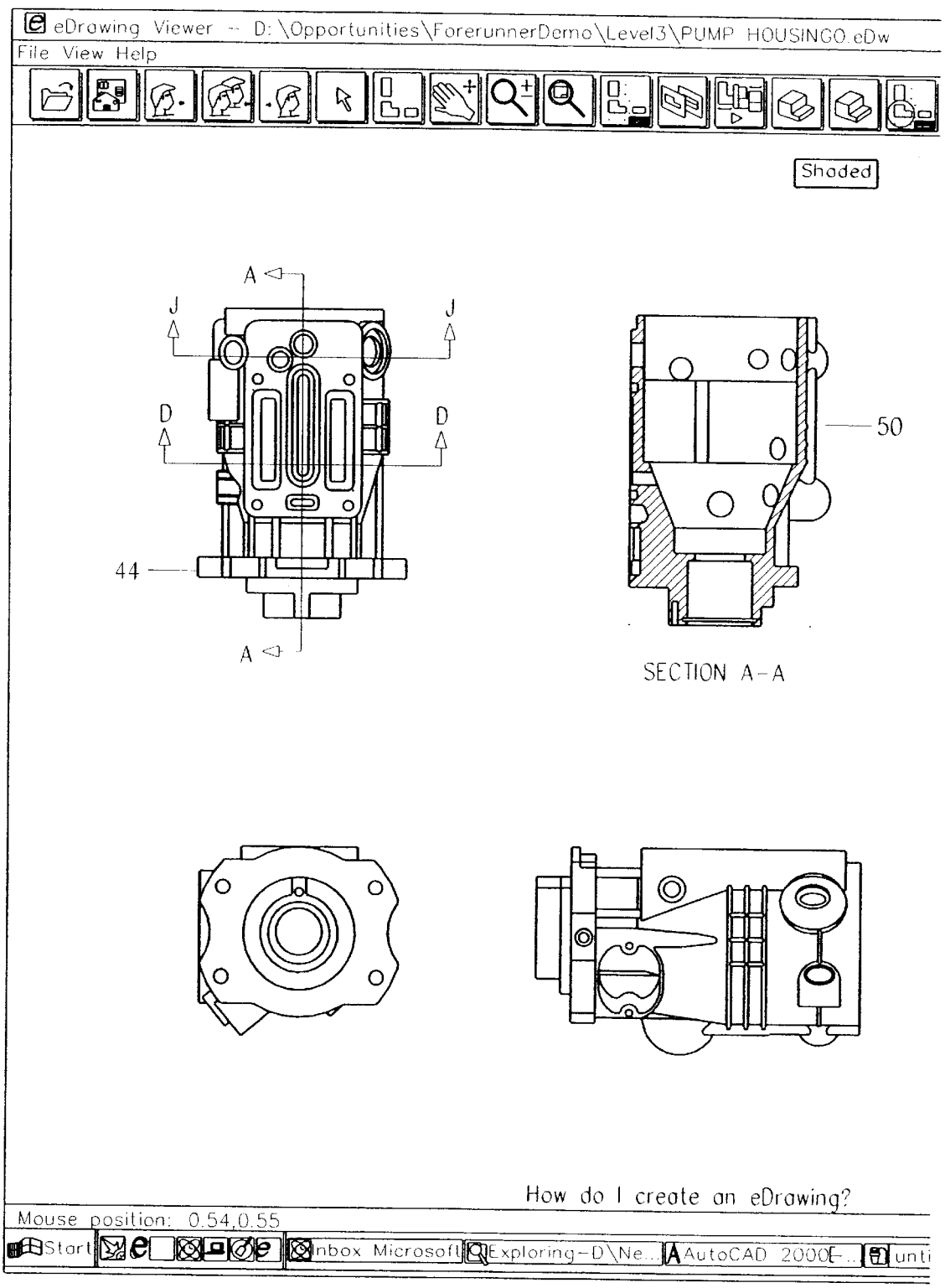
FIG. 7 depicts views of an object in a modeling window of a computer screen for illustrating a hyperlink process of the present systems and methods.

Also provided herein as a part of the computer-based system is a hyperlink process for simultaneously highlighting the coordinates of a viewed object and a corresponding other view on a computer screen. Referring to FIG. 7, the front view 44 and the section view 50 include the coordinates A—A, representing the location of a cut through the object modeled in the model window 40 of the computer screen 32. The hyperlink process identifies coordinates and the respective views that appear in the computer screen 32 and, when the cursor is positioned over a particular coordinate, the corresponding view is highlighted. For example, if the mouse is positioned over the coordinates A—A in the front view 44 at the location 52, then the section view 50 is also highlighted. Highlighting may be accomplished by changing the color, by using shading, or other conventional methods for highlighting an item of interest on a computer screen 32.

Figure 8:
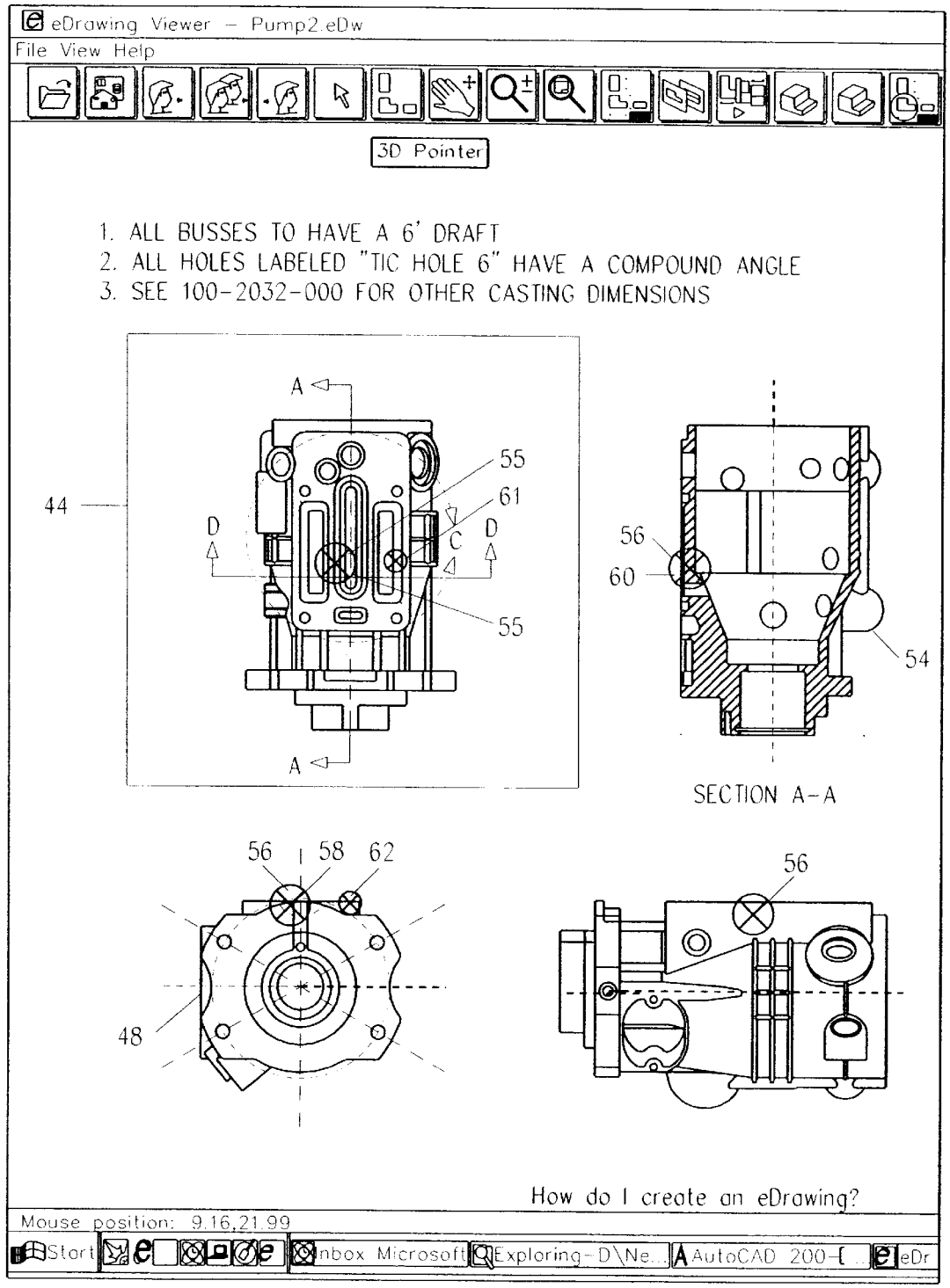
FIG. 8 depicts an object in a modeling window of a computer screen for illustrating a pointer process of the present systems and methods.

Also provided as a part of the computer-based system is a pointer for simultaneously pointing to the same point of a viewed object as the point appears in more than one view on a computer screen. Referring to FIG. 8, a pointer 56 may appear in one or more views of an object modeled in the modeling window 40 of the computer screen 32. For example, the pointer 56 may be located at the location 55 in the front view 44, which corresponds to the location 58 in the top view 48 and the location 60 in the detail view 54. When the pointer 56 is moved, such as by clicking and holding the mouse on the pointer 56, the pointer 56 moves in each of the views to a location that corresponds in each of the views. For example, if the pointer 56 is moved along a horizontal line in the view 44 to a location 61, then the pointer 56 in the top view 48 would move to a new location 62 in the section view 54. Similarly, the pointer 56 could move to a new location in the section view 54, but in this case, because the movement is along the axis of sight of the viewer, no movement would be apparent. Depending on the relationship of the views, the pointer 56 might move quite differently in different view. For example, if views are skew with respect to each other, then horizontal movement in one view might not result in any movement of the pointer in another view, because the horizontal movement might be along an axis of viewing in one of the views. The pointer process permits quick recognition of similar components in different views. A pointer may highlight a spot through color, shading, or other conventional means. Cross-hairs are depicted in FIG. 8 as an example of a pointer.

Figure 9:
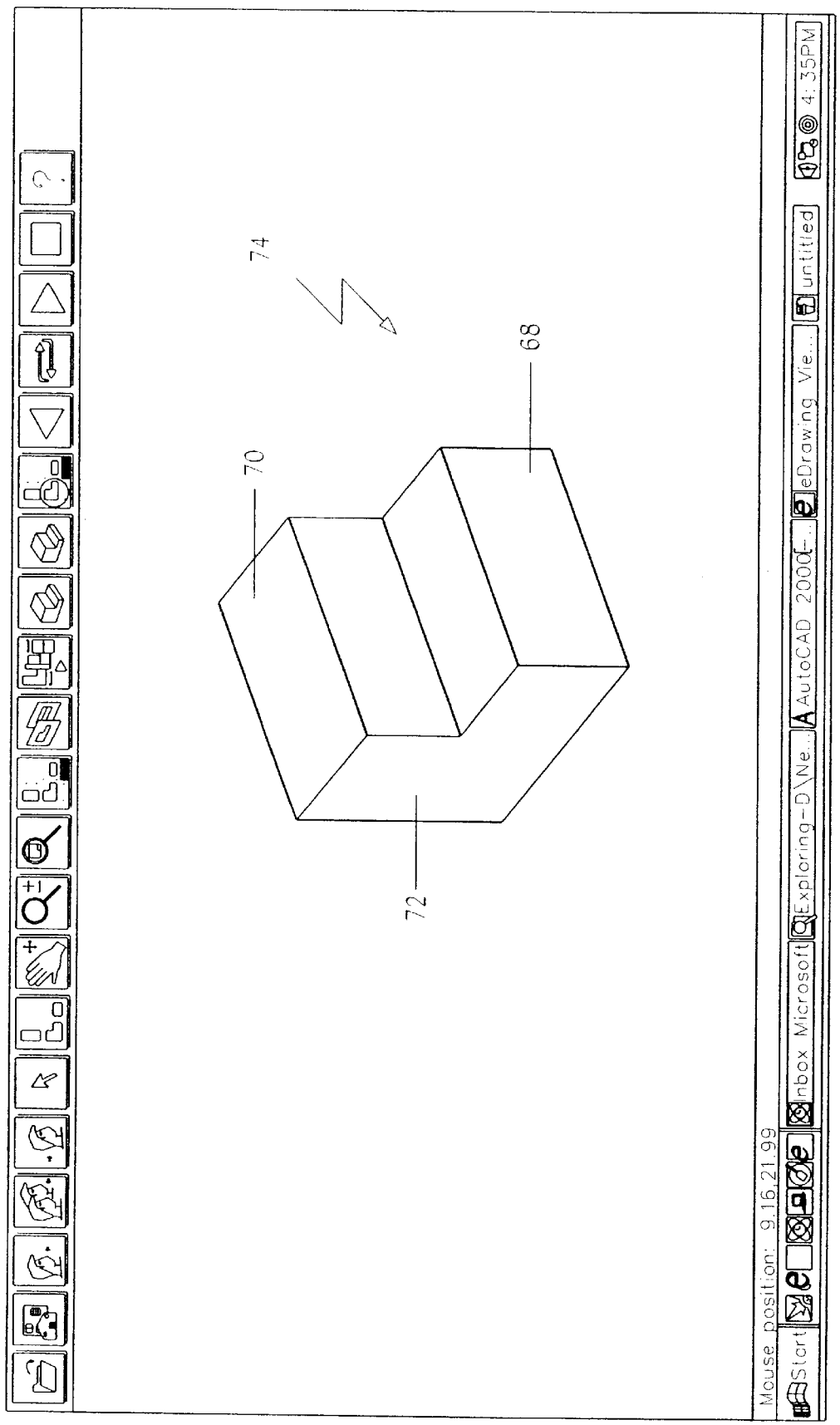
FIG. 9 depicts a simplified solid object in a modeling window of a computer screen.

Also provided herein as part of the computer-based system is a drawing animator for rotating a three dimensional depiction of a model about an axis of rotation and highlighting a two-dimensional view when the view is coincident with the plane of the drawing. Referring to FIG. 9, a simplified solid object is depicted in the modeling window 40 of the computer screen 32. Methods and systems for rotating such an object about one or more axes of rotation are well known in the area of computer aided design, such as those provided in the SolidWorks 99 product available from SolidWorks Corporation of Concord, Mass. In an animator process that is associated with a two-dimensional drawing having a plurality of views, the process may highlight a view when it is presented to the user. For example, referring to FIG. 9, a simple step 74 is depicted having a front side 68, and top side 70 and a right side 72. The step 74 is presented in FIG. 9 as partially rotated to show these three sides, with shading representing the different sides.

Figure 10:
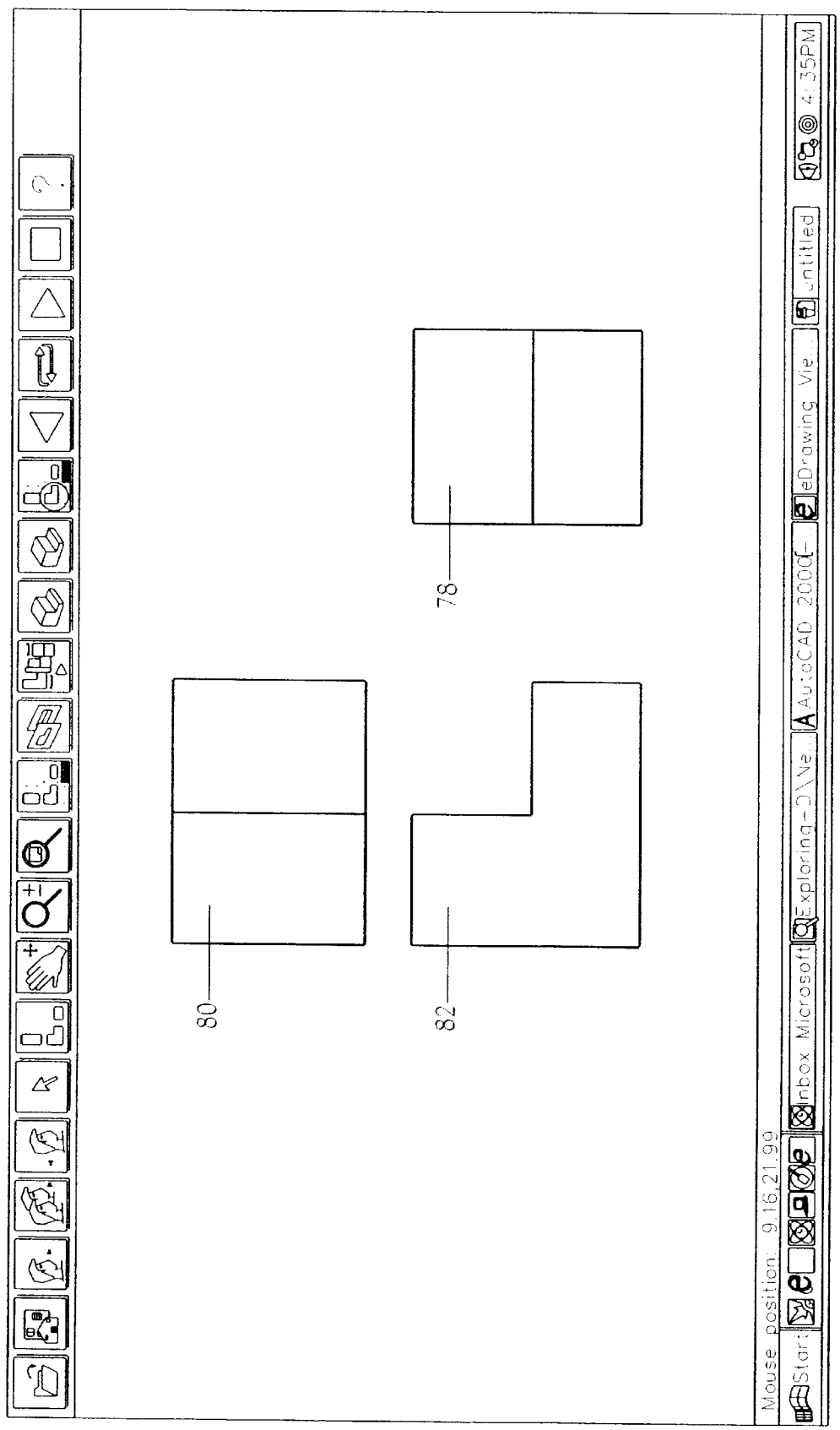
FIG. 10 depicts a schematic diagram with three two-dimensional views of the object of FIG. 9.

FIG. 10 depicts a two-dimensional drawing showing a front side view 78, and top side view 80 and a right side view 82, corresponding to a two-dimensional view of each of the sides of the step 74.

Figure 11:
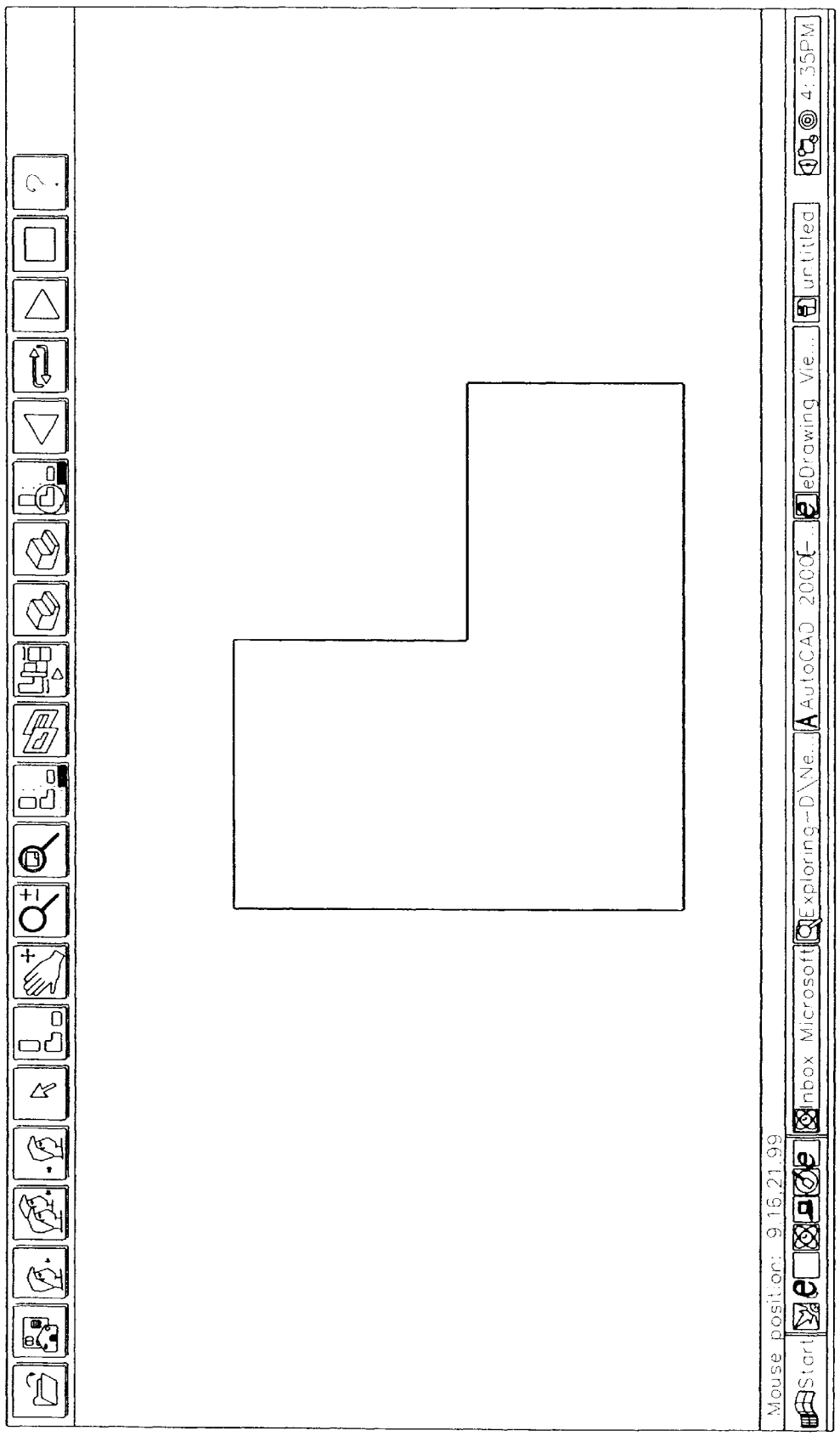
FIG. 11 depicts a single highlighted view after rotation of the object of FIG. 9.

Referring to FIG. 11, when the step 74 is rotated by the modeling program, a particular view is highlighted when it is presented directly to the user; i.e., when the side is co-planar with the computer screen and perpendicular to the line of sight of the viewer of the computer screen 32. Thus, the front side view 78, the top side view 80 and the right side view 82 are highlighted when the rotation presents them to the user. FIG. 11 depicts the right side view 72 after rotation of the step to the right from the position of FIG. 9. The animation feature enables the user to recognize the location of various views when they appear in the object. When an object has complicated cross sections, the animation permits the user to determine the orientation of various two-dimensional views relative to each other.

Figure 12:
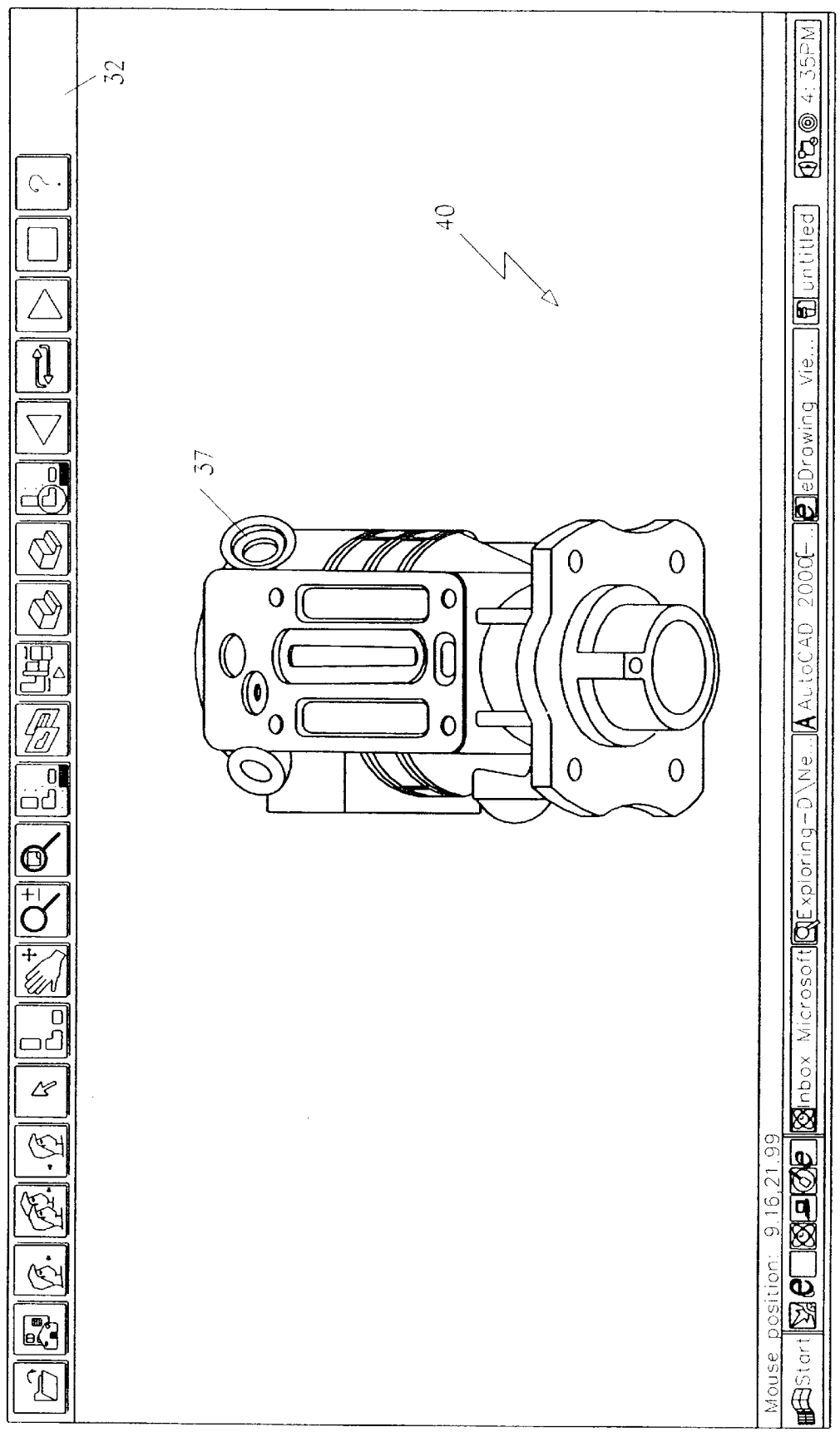
FIGS. 12 and 13 present, respectively, a three dimensional view of a pump housing during rotation and a two-dimensional view highlighted according to the process of the present invention.
Figure 13:
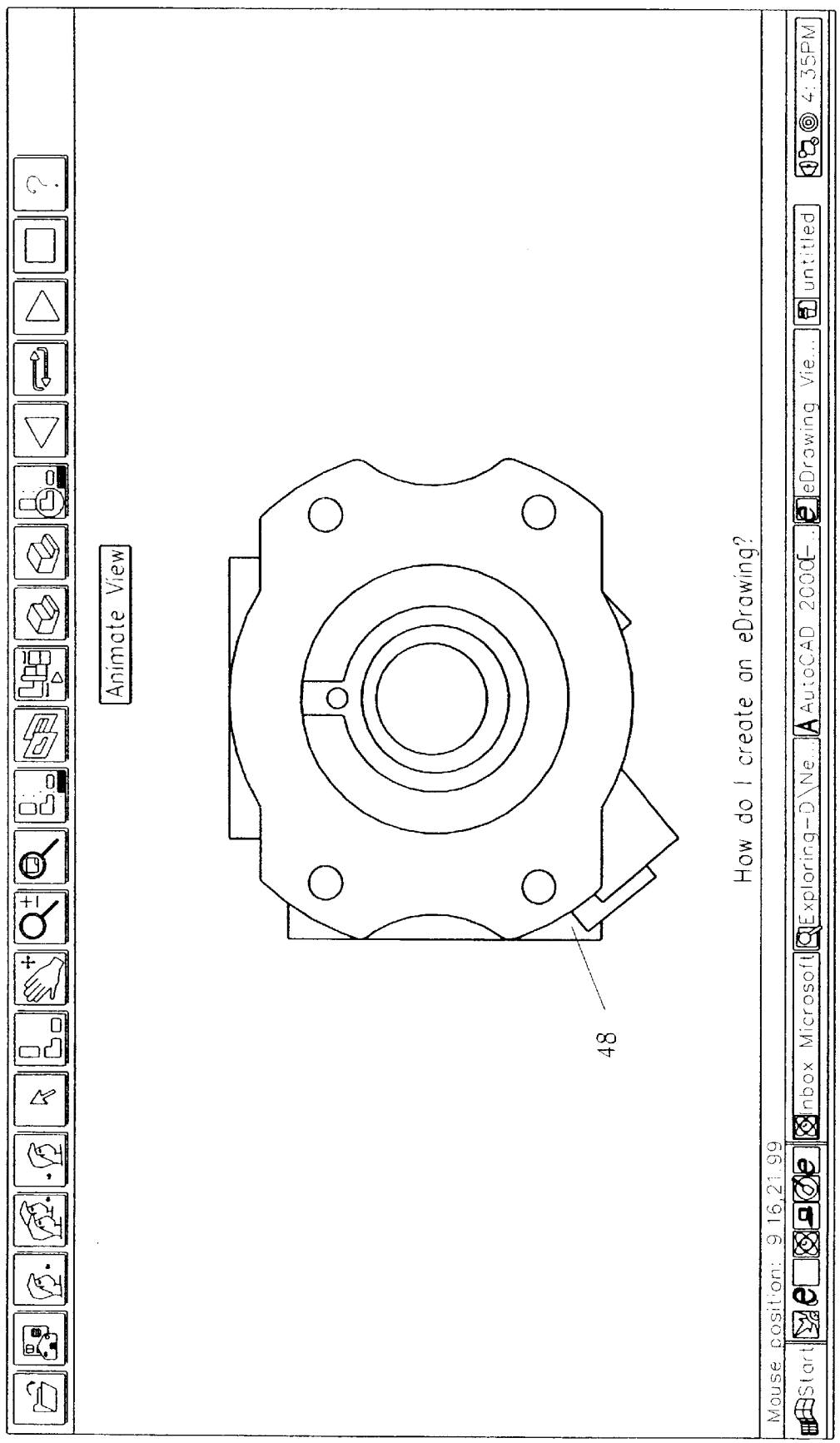

FIGS. 12 and 13 present, respectively, a three dimensional view of a pump housing 37 during rotation and a two-dimensional view highlighted according to the process of the present inventions. Specifically, FIG. 13 represents a top view 48 that would be highlighted when the pump housing 37 is rotated so that the top side faces the viewer of the computer screen 32.

Figure 14:
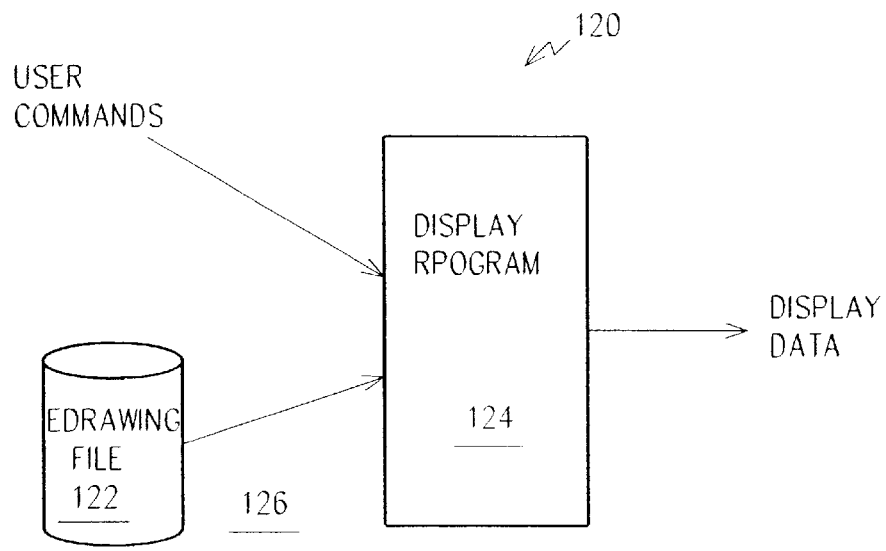
FIG. 14 depicts a system for providing the functionality of the systems and methods disclosed herein, including an electronic drawing file and a display program.

Referring to FIG. 14, a system 120 for providing the functionality discussed above and shown in FIGS. 1–13 includes an electronic drawing file 122 and a display program 124. The display program uses the electronic drawing file 122 and user commands to provide display data that may be shown on the computer screen 32 or printed out in a conventional manner. The electronic drawing file 122 and the display program 124 are discussed in more detail hereinafter.

In one embodiment, the electronic drawing file 122 and the display program 124 are stored together in a compressed metafile 126. The single compressed metafile 126 may then be provided to a user as a single file that, when uncompressed, includes both the display program 124 and the electronic drawing file 122. If the display program 124 is not too large, then it may be possible to send a substantial number of electronic drawings this way so that the recipient (s) always have the display program 124 for displaying the electronic drawing file 122. Compressing the electronic drawing file 122 and the display program 124 into a single compressed file 126 may be performed in any one of a number of conventional fashions using conventional software available for such purposes. In some instances, execution of the single compressed metafile 126 will cause automatic decompression and execution of the display program 124.

Figure 15:
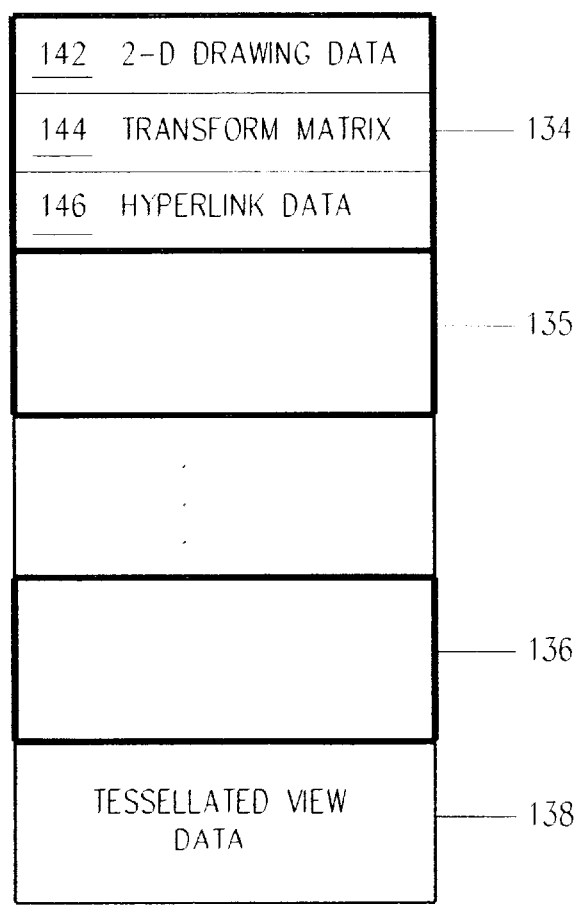
FIG. 15 depicts an electronic drawing file according to the present inventions

Referring to FIG. 15, the electronic drawing file 122 is shown as including a it g plurality of view data records 134–136 and a tessellated model data record 138. The view data record 134, which is shown in detail, includes two-dimensional drawing data 142, a transform matrix 144 and hyperlink data 146. Other view records 135 and 136 contain data analogous to that shown in detail for the view record 134. The tessellated model data record 138 includes data corresponding to a three dimensional tessellated view that is generated in a conventional manner from the three dimensional model in a manner described in more detail hereinafter in connection with the discussion regarding generation of the electronic drawing file 122.

Each of the view records 134–136 corresponds to one of the two-dimensional views, including views corresponding to section cuts and detail circles. The two-dimensional data 142 includes conventional two-dimensional drawing objects used to display the view corresponding to the record 134. These objects include commands to draw lines, circles, arcs, etc. Each of the view records 134–136 includes corresponding two-dimensional data for the corresponding view.

Associated with the model represented by the various view records 134–136 is an absolute base coordinate system that includes the orientation, translation, and scaling factor for the model as depicted by the various view records 134–136. Accordingly, the transform matrix 144 includes information indicating the translation, scale, and rotation of the view record 134 with respect to the absolute base for the model represented by the view records 134–136. As is known in the art, the transform matrix is a four-by-four array that contains specific numbers indicating the translation, scale, and rotation. A discussion of such transformation matrices may be found in *Computer Graphics Principles and Practice*, by Foley, VanDam, Feiner, and Hughes, published by Addison-Wesley, of New York, N.Y.

The hyperlink data 146 contains data that links portions of the two-dimensional data 142 of some of the records 134–136 with other ones of the records. In the case of a section view, the hyperlink data 146 would contain an identification of the particular section line stored in the two-dimensional data 142 and associate that information with another one of the views 135 and 136 that corresponds to the particular section line in the two-dimensional data 142. Similarly, for detail circles, the hyperlink data 146 would identify particular item or items of the two-dimensional data 142 that shows the circle in the view corresponding to the record 134 and links that information with another one of the views 135 and 136 that corresponds to the detail circle. Generation of the hyperlink data 146 is discussed in more detail hereinafter in connection with the discussion regarding generation of the electronic drawing file 122.

Figure 16:
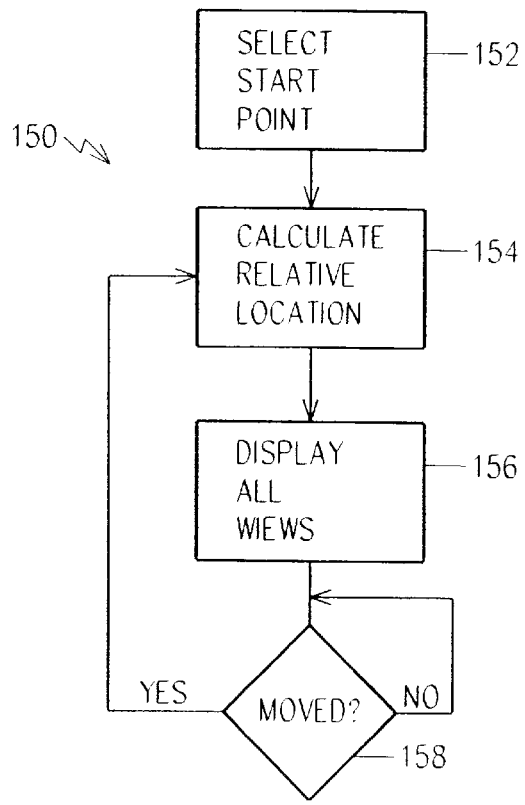
FIG. 16 is a flow chart illustrating steps used in connection with implementing the pointer process disclosed in connection with FIG. 10.

Referring to FIG. 16, a flow chart 150 illustrates steps used in connection with implementing the pointer 56. At a first step 152, a start point for the pointer 56 is selected. The start point for the pointer could be any point in three dimensional space, such as the origin of the absolute coordinate system. However, in one embodiment, the start point may be chosen by selecting a visible point on a displayed view for two of the three coordinates and then using that point to calculate the third coordinate corresponding to a visible point on a second, orthogonal view to the first selected view.

Following the step 152 is a step 154 where the location of the pointer 56 is calculated for all of the views. The location of the pointer 56 is stored as three values corresponding to the X, Y, and Z coordinates, in the absolute coordinate system. Accordingly, at the step 154, the relative location of the pointer 56 for each of the views is determined by using the transform matrix associated with each view and applying the transform matrix to the absolute coordinates of the pointer 56. Thus, at the step 154, application of the transform matrix to the absolute coordinates of the pointer 56 provides a relative position of the pointer 56 for each of the views. Following the step 154 is a step 156 where the pointer 56 is displayed in all of the views of a modeling window 40 of the computer screen 32. Displaying the pointer 56 at the step 156 is provided in the conventional manner, by using the relative location information determined at the step 154 and providing an appropriate symbol, such as a dot or a crosshair, on each of the views to indicate the location of the pointer 56 in each of the views. In some embodiments, the pointer 56 may be provided in a different color than the drawing portion of the views.

Following the step 156 is a test step 158 that determines whether the pointer 56 is moved by the user. Note that the user may move the pointer 56 in any one of the views where the pointer 56 is visible. Movement is accomplished in a conventional manner, such as by using the mouse to drag the pointer 56 in one of the views. If it is determined at the step 158 that the user has moved the pointer 56, then control transfers back to the step 154 where the location of the pointer 56 is recalculated in each view, using the transform matrices and other steps indicated in connection with the discussion of the step 154 above. Thus, if the user chooses to move the pointer 56 in a particular view, then the absolute location of the pointer 56 may be calculated by first applying the inverse transform matrix for that view to the relative position of the pointer 56 in the view to provide an absolute location of the pointer 56. Once the absolute location of the pointer 56 is known, then it is possible to apply the transform matrix for each view to determine the relative position of the pointer 56 in each view as discussed above.

Figure 17:
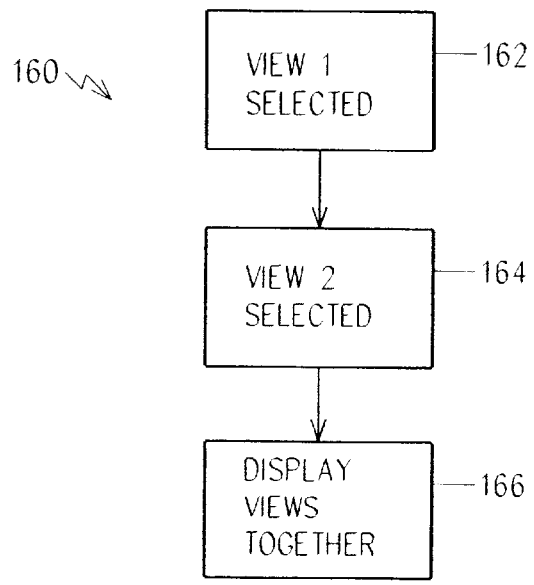
FIG. 17 is a flow chart indicating the steps for implementing the virtual folding feature described in connection with FIGS. 6, 7 and 8.

Referring to FIG. 17, a flow chart 160 indicates the steps for implementing the virtual folding feature described in connection with FIGS. 6, 7 and 8 above. At a first step 162, a first view is selected. Selection of a view can include having a user specifically click on a view after actuating the virtual folding feature. Following the step 162 is a step 164 where a second view is selected. Just as with the first view, selected in the step 162, selecting the second view can include having a user click the mouse to highlight the second view after activating the virtual folding feature. Following step 164 is a step 166 where the system displays the views together. The step 166 may be implemented in a conventional fashion by using the two-dimensional drawing data for each of the views and by applying a transformation matrix to at least one of the views so that both views appear in proximity to each other on the computer screen. Note also that, if the two views are projections of one another, the views may be snapped to horizontal or vertical alignment in accordance with conventional drafting standards, such as ANSI or ISO.

Figure 18:
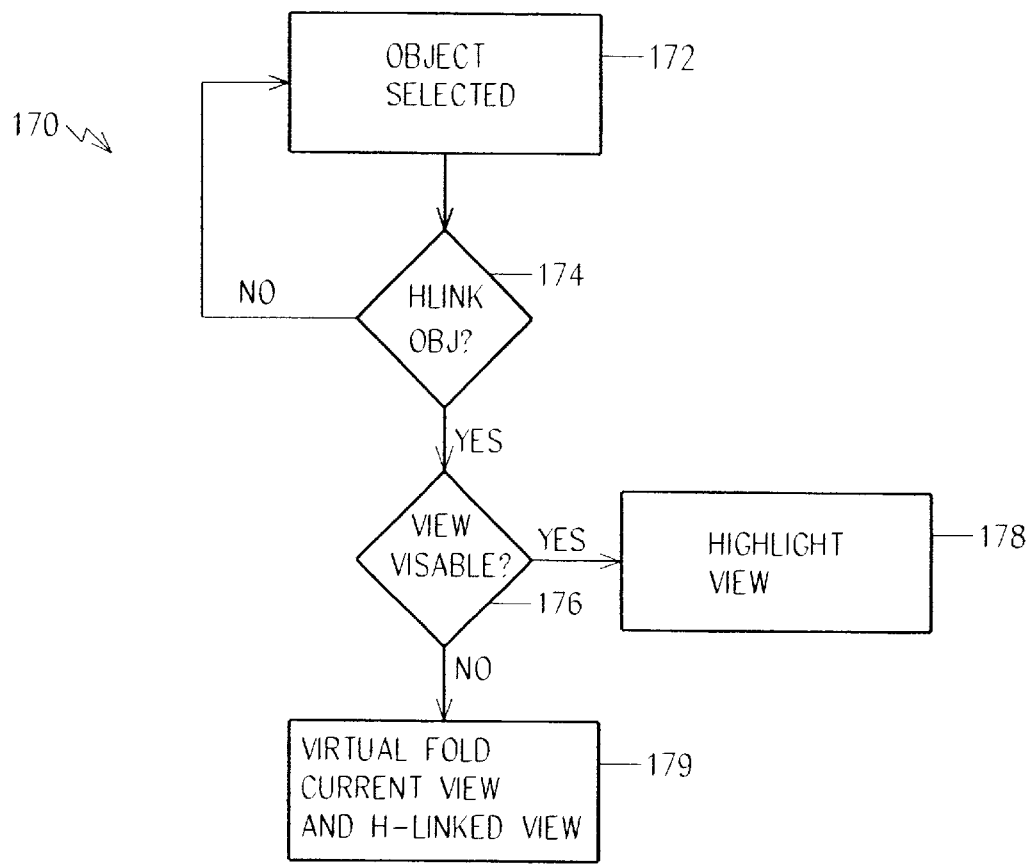
FIG. 18 is a flow chart that illustrates steps for hyperlinking a section line or detail circle of one view to another view corresponding to the section line or detail circle.

Referring to FIG. 18, a flow chart 170 illustrates steps for hyperlinking a section line or detail circle of one view to another view corresponding to the section line or detail circle. Processing begins at a first step 172 where an object in the current view is selected. Selecting the object at the step 172 may involve having the user point the mouse to the object and click on it in a conventional manner. Following step 172 is a test step 174 where it is determined if the object selected at the step 172 is a hyperlink object. Note that a hyperlink object includes objects that cause a hyper link between two views, such as a section line or detail circle. As discussed above, the hyperlink information is stored with each of the views, so that determining if the selected object is a hyperlink object at the step 174 involves reviewing the hyperlink data to determine if the selected object corresponds to a hyperlink object. If it is determined at the step 174 that the selected object is not a hyperlink object, then control passes back to the step 172 to wait for selection of another object. Otherwise, if it is determined at the step 174 that the selected object is a hyperlink object, then control passes from the step 174 to a test step 176 where it is determined whether the view corresponding to the selected object is currently visible. If so, then control passes from the test step 176 to a step 178 where the view is highlighted in a conventional manner. Alternatively, if it is determined at the test step 176 that the view corresponding to the hyperlink is not currently visible, then control passes from the step 176 to a step 179 where the current view and the view corresponding to the hyperlink object are virtually folded so that the views appear together. Virtual folding is discussed above in connection with FIG. 17.

Figure 19:
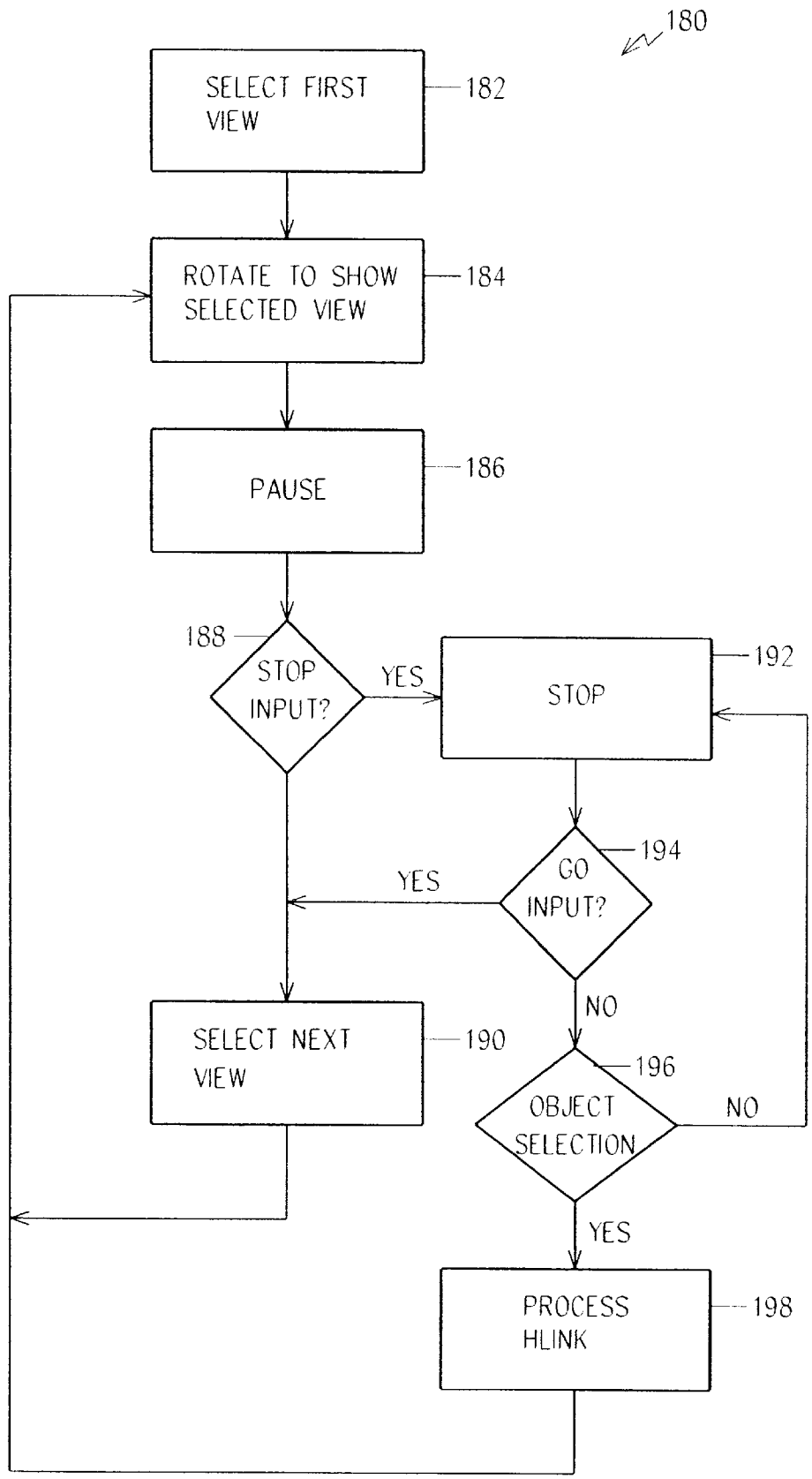
FIG. 19 is a flow chart that illustrates steps performed in connection with the animation features.

Referring to FIG. 19, a flow chart 180 illustrates steps performed in connection with the animation feature discussed above. At a first step 182, a first view is selected, as discussed above. The animation iterates through each of the views by rotating a three dimensional tessellated depiction of the model in the modeling window 40. There is no particular order required as to the selection of a view, except when hyperlinking is invoked, as discussed below.

Following step 182 is a step 184 where the three dimensional model is rotated to present the selected view. In the case of section cut, the portion of the model that is in front of the section cut is removed so that the inside portion, where the section cut is taken, is shown. Following the step 184 is a step 186 where the animated model is paused to show the user the model with the selected view facing forward. Following the step 186 is a test step 188 where it is determined whether the user has input a stop command. The user may input a stop command at any time during the animation to stop the animation process and see a particular view. If it is determined at the test step 188 that a stop command has not been entered, then control passes from the step 188 to a step 190, where a new view is selected. Following the step 190, control passes back to the step 184 where the tessellated model is rotated to the newly selected view.

Note that rotation of a three dimensional model, in particular rotation of a tessellated version of a three dimensional model, is known in the art. Note also that it is possible to correlate the various two-dimensional views with particular orientation of the model using the transformation matrix associated with each view.

If it is determined at the test step 188 that a stop command has been entered by the user, the control passes from a step 188 to a step 192 where the animation stops. Once the animation stops, the view remains static and the three dimensional model does not move. Following the step 192 is a test step 194, where it is determined if the user has clicked on the "go" button. If so, the control passes from a step 194 back to a step 190, where a new view is selected so that animation may continue. As discussed above, following step 190 is the step 184 where the tessellated model is rotated to the selected view.

If it is determined at the step 194 that the user has not selected the "go" button, then control passes from a step 194 to a step of 196, where it is determined whether the user has selected an object from the presented view. If an object is not selected, the control passes back to the step 192, discussed above. Otherwise, if it is determined at the test step 196, that an object has been selected (while the animation has been stopped, as determined in the step 188), then control passes from the step 196 to the step 198 where hyperliink processing is performed. As discussed above, hyperlink processing occurs when a selected object corresponds to a section view or a detail circle in one view that correlates to another view. If the user has stopped the animation and selected an object then the step 198 is performed to determine whether a hyperlink and/or virtual folding view needs to be performed. Accordingly, the process of the step 198 corresponds to the process, discussed above, in connection with the processing of FIGS. 17 and 18. Following the step 198, control passes back to the step 184 to rotate the tessellated model to present the view indicated by the by hyperlink and/or the virtual folding link.

Figure 20:
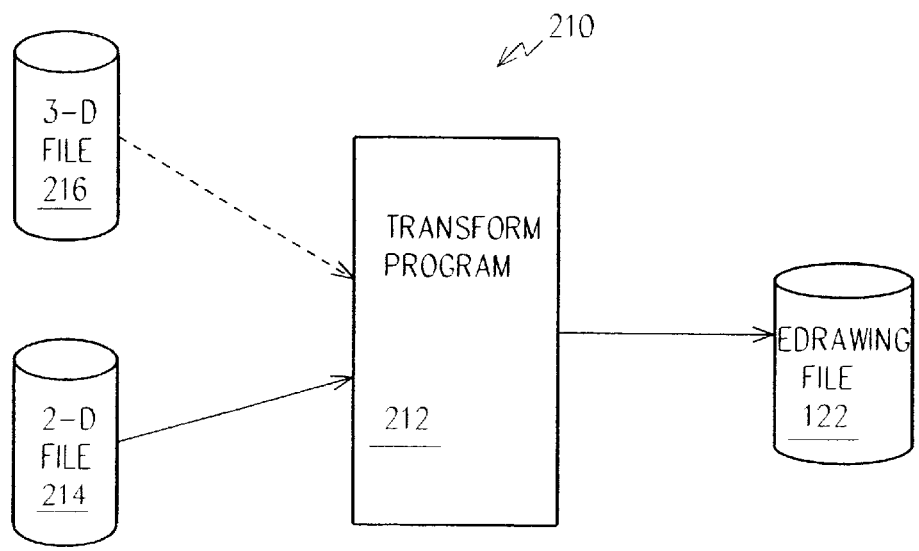
FIG. 20 is a schematic diagram illustrating a process in which a transform program creates the electronic drawing file using a two-dimensional file and, optionally, a three-dimensional file.

Referring to FIG. 20, a schematic diagram 210 illustrates a process in which a transform program 212 creates the electronic drawing file 122 using a two-dimensional file 214 and, optionally, a three dimensional file 216. The two-dimensional file 214 may be a conventional two-dimensional file that is generated in a conventional manner using a solid modeling program. Many solid modeling programs, such as the SolidWorks program, which is available from SolidWorks Corporation of Concord, Mass., have a built in mechanism allowing the user to automatically generate a two-dimensional file, such as the two-dimensional serial file 214, that includes a plurality of two-dimensional views corresponding to the solid model created by the user. In addition to the conventional two-dimensional drawing commands and plurality of views, the two-dimensional file 214 may also contain the transform matrix for each of the views that orients each of the views with respect to the solid model. Thus, at least two of the components shown in FIG. 15 and described above, the two-dimensional data 142 and the transform matrix 144, are already provided in the two-dimensional file 214.

Some of the views in the conventional two-dimensional file 214 may be section cuts or detail circles of other views. In that case, that information would also be contained in the two-dimensional file 214, since such information may be generated from a solid model and from the portions of the solid model selected by the user for sectioning and for providing detail. Thus, the hyperlink information, or information which can easily be converted to hyperlink information, is also provided in the two-dimensional file 214. That is, the hyperlink data 146 shown in FIG. 15 may be provided in the two-dimensional file 21 two-dimensional electronic drawing or, alternatively, information which may be easily converted to hyperlink data 146 in a conventional manner may be found in the two-dimensional file 214.

The tessellated view data 138 shown in FIG. 15 may be provided by the three-dimensional file 216 in a conventional manner. Note that many three dimensional or solid modeling programs include a solid tessellated view of the model created by the user. Alternatively, when the two-dimensional file 214 is created by the modeling program, the tessellated view may be included therewith even though the tessellated view is not part of the two-dimensional views.

The transform program 212 takes the information from the two-dimensional file 214 and optionally, as discussed above, information from the three dimensional file 216 and creates the electronic drawing file 122 having a format analogous to that shown in FIG. 15 and discussed above. Since most of the relevant information is already contained in the two-dimensional file 214 and, optionally, the three dimensional file 216, the transform program 212 simply converts the format of the data in a conventional and straightforward manner to provide the proper format for the electronic drawing file 122.

Figure 21:
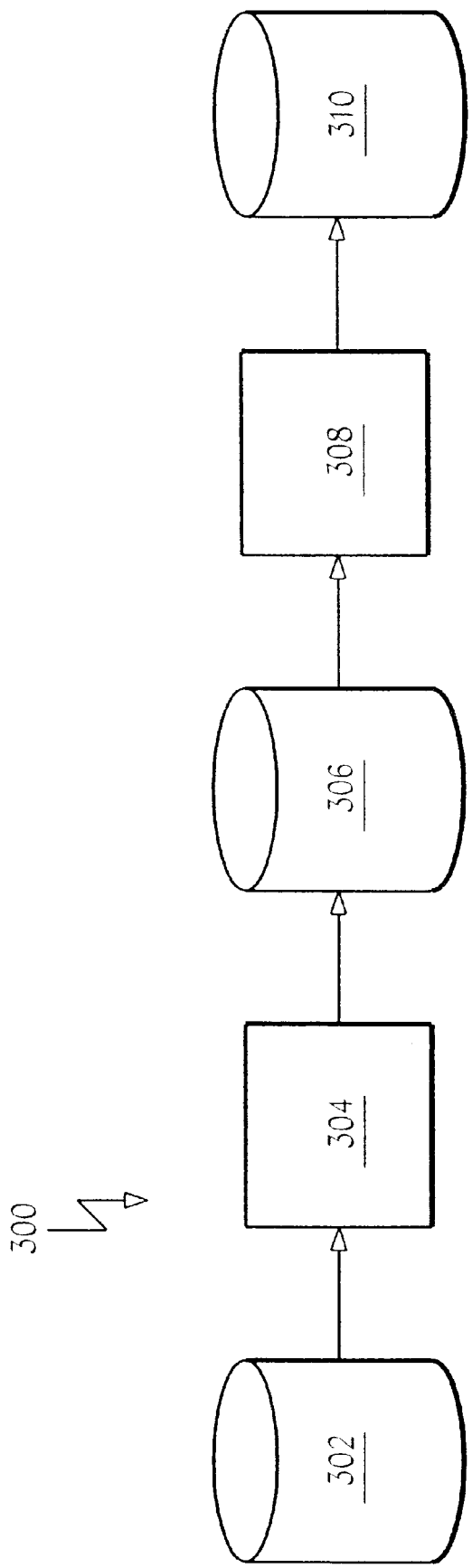
FIG. 21 is a data flow diagram illustrating conversion of a two-dimensional file to a drawing file according to the present invention.

Alternatively, a two-dimensional representation may be converted to a drawing file. Referring to FIG. 21, a data flow diagram 300 illustrates a process that converts a two-dimensional file 302, such as a file created using AutoCad software. Note that, in some embodiments, the file 302 may contain other information that is not used by the system described herein, such as other 3-D or pseudo 3-D information. A reformatter 304 converts data from the two-dimensional file 302 and stores the data in a generic file 306. Note that the two-dimensional file 302 may contain data in any one of a number of formats, such as the AutoCad format. The reformatter 304 simply accesses and reads the particular format of the two-dimensional file 302 and converts the contents thereof to a generic format that can be more easily accessed by follow on processing. The two-dimensional file 302 may be created using any one of a number of commercially available two-dimensional drafting packages, such as the AutoCad package provided by AutoDesk, that may be accessed by the reformatter 304 to provide the generic file 306.

The generic file 306 contains a generic data structure that describes the two-dimensional objects from the two-dimensional file 302. The generic data structure includes conventional descriptors for each of the objects (e.g., object type, location, size, etc.). In addition, for some objects, such as dimension indicators, the generic data structure includes a "critical point" descriptor that indicates a point on the object that can be used to associate the object with a particular view, as described in more detail hereinafter.

The generic file 306 is provided as an input to an interpreter 308 which, in a manner discussed in more detail below, converts data from the generic file 306 into an electronic drawing file 310 that can be used in a manner similar to that discussed above. In some embodiments, the electronic drawing file 310 created from the two-dimensional file 302 may not have either a tessellated view or transform matricies for each of the views, as illustrated above in connection with the drawing file 122 created from the three-dimensional file 216 and the two-dimensional file 214 provided by a solid modeling program. In addition, the electronic drawing file 310 may not contain other features present in the electronic drawing file 122 discussed above.

The two-dimensional file 302 and the generic file 306 contain conventional two-dimensional graphic objects such as line draw objects, objects that represent circles and ellipses, objects that represent squares and rectangles, etc. As discussed in more detail below, the interpreter 308 may associate the two-dimensional objects with particular views of a drawing, thus making it possible to provide the electronic drawing functionality discussed above. Note, however, that in instances where the drawing file 310 does not contain all of the features of the drawing file 122 created from the three-dimensional file 216 and the two-dimensional file 214 provided by a solid modeling program, then all of the viewing features, discussed above, may not be available for the drawing file 310.

Figure 22:
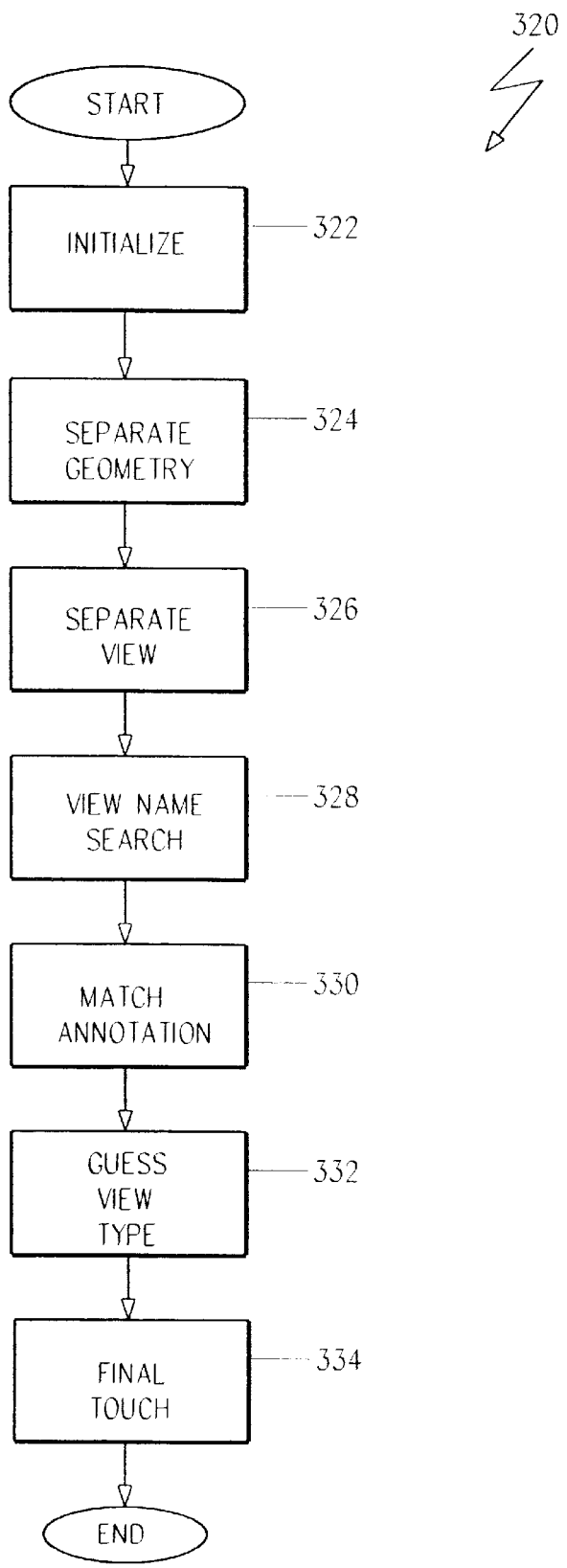
FIG. 22 is a flow chart illustrating steps performed in connection with conversion of a two-dimensional file to a drawing file according to the present invention.

Referring to FIG. 22, a flow chart 320 illustrates operation by the interpreter 308 in connection with converting the generic data structure that describes the 2-D drawing stored in the generic file 306 into the electronic drawing file 310. At a first step 322, initialization is performed. At the initialization step 322, most of the 2-D objects are removed from groups, degenerate objects such as zero length lines and circles with zero radius are deleted, convex hulls (described below) are calculated for each object, and proximity and intersection graphs (described below) are created. Operations performed at the initialization step 322 are described in more detail hereinafter.

Following step 322 is a step 324 where various types of geometry are separated from the drawing. Specifically, at the step 324, arrowheads, arrowheads with lines, arrowheads with arcs, detail circles, section lines, and obvious non-curve, non-polygon annotation are separated from the drawing in order to facilitate follow on processing. Operations performed at the separate geometry step 324 are described in more detail hereinafter.

Following step 324 is a step 326 where the views are separated. Separating the views involves finding a border for the drawing (if there is a border), finding each of the views, and associating graphic objects from the drawing with particular ones of the views. Operations performed at the separate view step 326 are described in more detail hereinafter.

Following step 326 is a step 328 where a view name search is performed. The view name search looks at the text in the drawing for strings that correspond to words such as "section" and "detail" (and, in some embodiments, multilingual equivalent thereof) indicating particular views have particular characteristics such as being section or detail views that correspond to section lines and detail circles contained in other views. Operations performed at the view name search step 328 are described in more detail hereinafter. Following step 328 is a step 330 where an annotation match is performed. The annotation match matches annotation to particular views. Operations performed at the match annotation step 330 are described in more detail hereinafter.

Following step 330 is a step 332 where view types are guessed. Guessing the view types involves determining which views are borders. Operations performed at the guess view type step 332 are described in more detail hereinafter.

Following the step 332 is a step 334 where the final touches are performed on the data. The final touches include inserting hyperlinks based on previously calculated detail circles and section lines. Inserting the hyperlinks is fairly straight-forward once the detail circles, section lines and corresponding view relationships are determined, which is discussed in more detail below.

Figure 23:
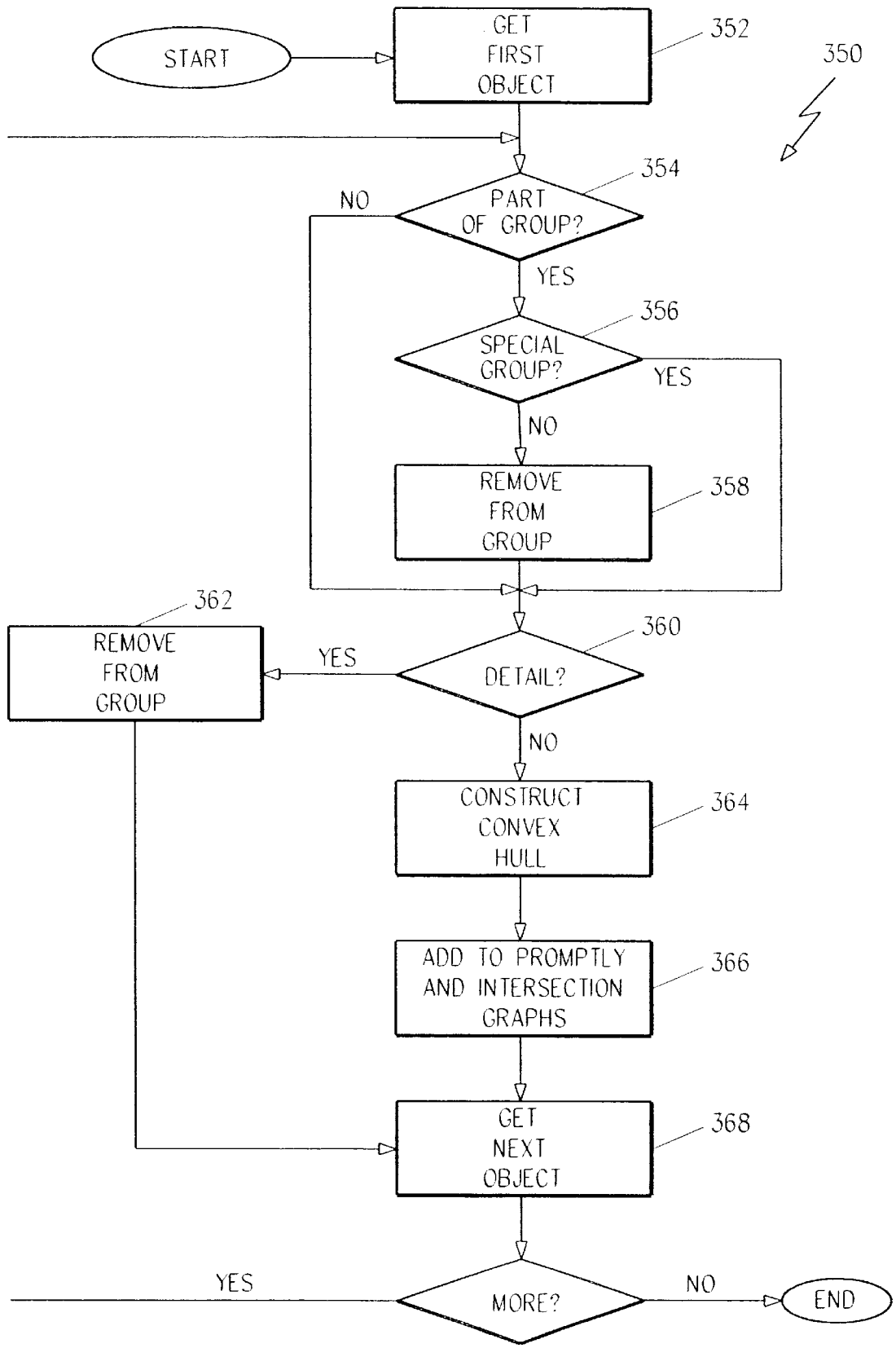
FIG. 23 is a flow chart illustrating initialization operations performed in connection with conversion of a two-dimensional file to a drawing file according to an aspect of the present invention.

Referring to FIG. 23, a flow chart 350 illustrates operations performed at the initialization step 322 of FIG. 22. Initialization includes accessing the data in the generic data structure stored in the generic file 306. The generic data structure, which may be an array of records, is accessed and modified for subsequent processing, as described below.

Processing begins at a first step 352 where the first object of the generic data structure is obtained. Processing of the objects in the generic data structure includes iterating through each of the objects and processing each object in accordance with the description set forth below. Following the step 352 is a test step 354 where it is determined if the object being processed is part of a group. As discussed below, most, but not all, objects are ungrouped in order to facilitate follow on processing.

If it is determined at the test step 354 that the object being processed is part of a group, then control passes from the step 354 to a step 356 that determine if the object is part of a "special group". For some 2-D drafting packages, there are certain special groups that are useful to maintain. For example, in the case of a file created using AutoCad, the special groups may include groups named "leaders", "dimensions", "crosshatch", and "block reference". In certain instances, it may not be beneficial to dissociate the objects in the group from the group.

If it is determined at the test step 356 that the object being examined is not part of a special group, then control passes from the test step 356 to a step 358 where the object is removed from the group by, for example, dissociating the object from the group. Dissociating an object from a group is straight-forward to one of ordinary skill in the art.

Following the step 358 is a test step 360 where it is determined if the object is degenerate. Note also that the step 360 follows the test step 354 if the object is not part of a group and follows the test step 356 if the object is part of a special group. The testing performed at the step 360 determines if the object is, for example, a line with zero length or a circle having zero radius. Note that it may be possible for degenerate objects to be created by the 2-D drafting process without subsequently being removed, since such objects may not to be visible to the user. However, for follow on processing in the system described herein, it is useful to remove degenerate objects.

If it is determined at the test step 360 that the object being processed is degenerate, then control passes from the step 360 to a step 362 where the object is removed from the generic data structure. Alternatively, if it is determined at the test step 360 that the object is not degenerate, then control passes from the step 360 to a step 364 where a convex hull is constructed about the object. A convex hull is known in the art and is analogous to stretching a rubber band around the object to help define the boundary of the object for follow on processing. In some embodiments, the Graham's Scan algorithm, which is known in the art, is used to construct the convex hulls at the step 364, although it will be apparent to one of ordinary skill in the art that other algorithms may also be used.

Following the step 364 is a step 366 where the object is added to proximity and intersection graphs, which are discussed in more detail below. Following the step 366 is a step 368 where the next object from the data structure is fetched for additional processing. Note that the step 368 also follows the step 362 where, as discussed above, a degenerate object is removed. Following the step 368 is a test step 370 which determines if there are more objects to be processed. If not, then the initialization processing is complete. Otherwise, control passes from the step 370 back to the step 354 to process the next object.

Note that the steps of the flow chart 350 may be performed in a different order and that, in some embodiments, it may be possible to first iterate through all the objects to remove degenerate objects, then iterate through all of the objects again to construct the convex hulls, and then iterate through the objects to construct the proximity and intersection graphs.

Figure 24:
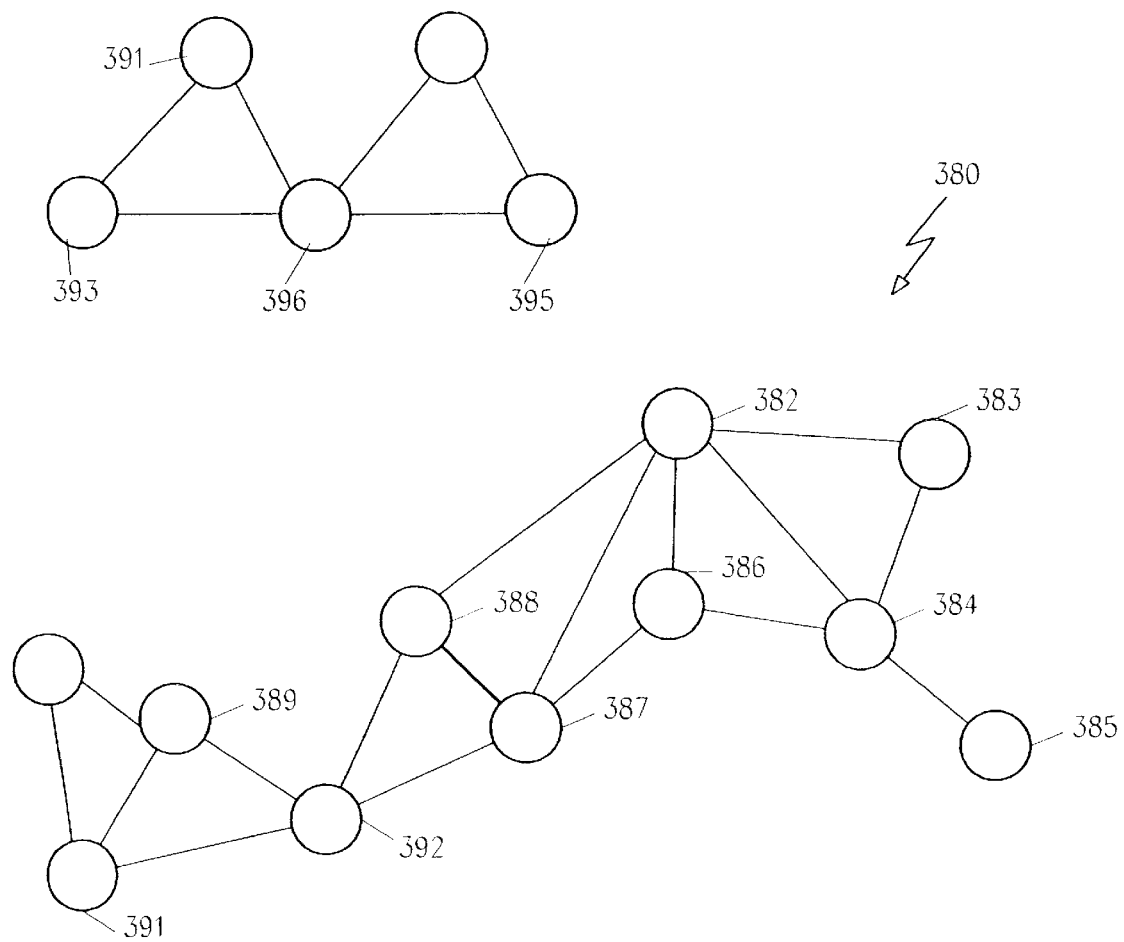
FIG. 24 is a schematic diagram illustrating an intersection/proximity graph used by the system provided according to an aspect of the present invention.

Referring to FIG. 24, a graph 380 is shown as having a plurality of nodes 382–397. The graph 380 could either represent a proximity graph or an intersection graph. Each of the nodes 382–397 represents an object from the generic data structure. The edges of the graph 380 (i.e., the connectors between the nodes) represent intersection (in the case of an intersection graph) or proximity (in the case of a proximity graph) of the objects. Thus, for example, a connection between the node 382 and the node 383 indicates that an object corresponding to the node 382 either intersects (in the case of an intersection graph) or is in proximity to (in the case of a proximity graph) an object associated with the node 383. Note that, for the graph 380, the nodes 382–392 are not connected to the nodes 393–397. Thus, the nodes 382–392 represent a set of objects that do not intersect (or are not in proximity) with any of the objects represented by the nodes 393–397.

Construction of the graph 380 is fairly straight forward using the convex hulls constructed at the step 364 of FIG. 23. In the case of an intersection graph, two objects are deemed to intersect if any of the lines that make up the polygons for the convex hulls for the object cross, the determination of which is straight-forward for one of ordinary skill in the art or if one of the objects is contained entirely in another object. The determination that one object contains another may be made in a straight forward manner familiar to one of ordinary skill in the art. One technique for determining if one object is contained in another (assuming that the convex hulls for the objects do not have lines that intersect) is to cast a ray from a point on the object having the smaller area. If the ray intersects bounding lines of the convex hull of the object having the larger area an odd number of times, then the object having the smaller area is contained in the object having the larger area.

In the case of the proximity graph, the convex hulls for the objects are first expanded by an amount equal to the amount of desired proximity (i.e., the minimum degree of closeness for object to be deemed proximate). After the expansion, it is determined if any of the lines that make up the polygons of the expanded convex hulls cross.

Figure 25:
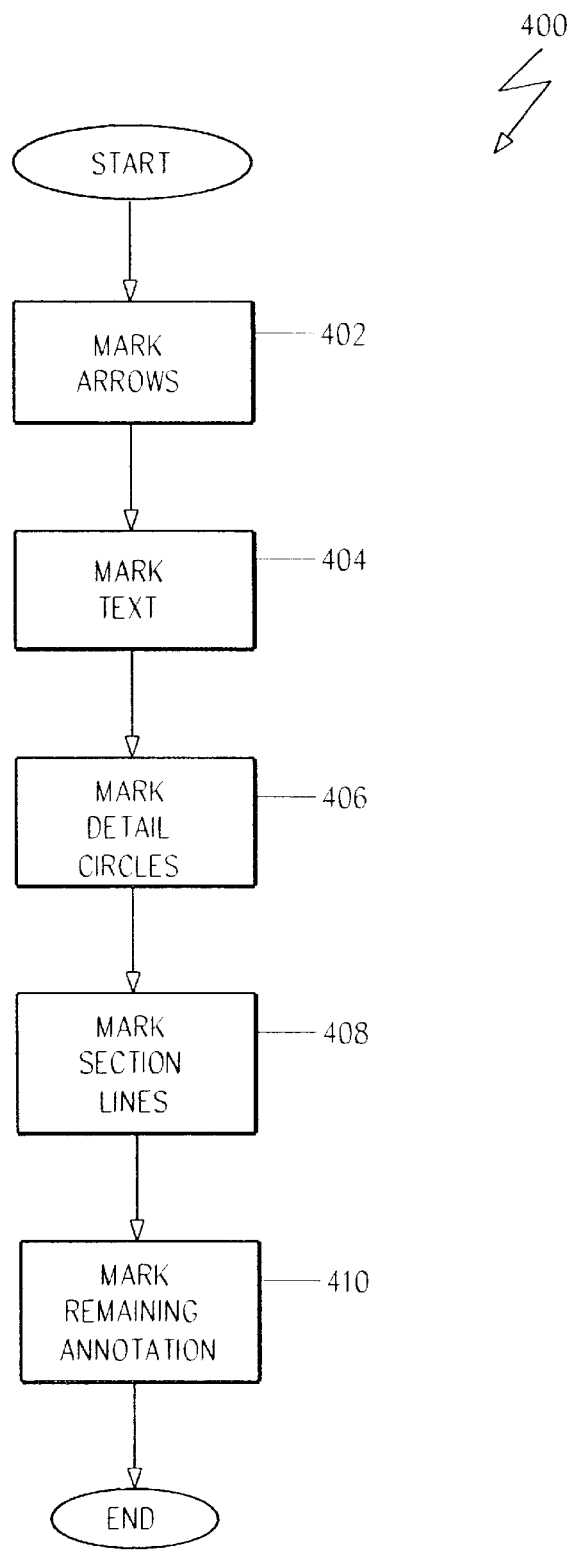
FIG. 25 is a flow chart illustrating steps performed in connection with separating graphic entities according to an aspect of the present invention.

Referring to FIG. 25, a flow chart 400 illustrates operations at the separate geometry step 324 of FIG. 22. At a first step 402, arrows are detected and marked so that arrows are eliminated from consideration for some of the follow on processing, as discussed below. Marking the objects may include, for example, modifying the generic data structure.

Following step 402 is a step 404 where objects corresponding to text are marked in a manner similar to the marking of objects corresponding to arrows, discussed above. Following the step 404 is a step 406 where objects corresponding to detail circles are marked. Following the step 406 is a step 408 where objects corresponding to section lines are marked. Following the step 408 is a step 410 where objects that do not correspond to a curve, hatch, or a polygon are marked. Note that curves include lines, circles, ellipses, arcs, splines and open polygons. Detecting objects that are marked in the steps 402, 404, 406, and 410 is discussed in more detail hereinafter.

Figure 26:
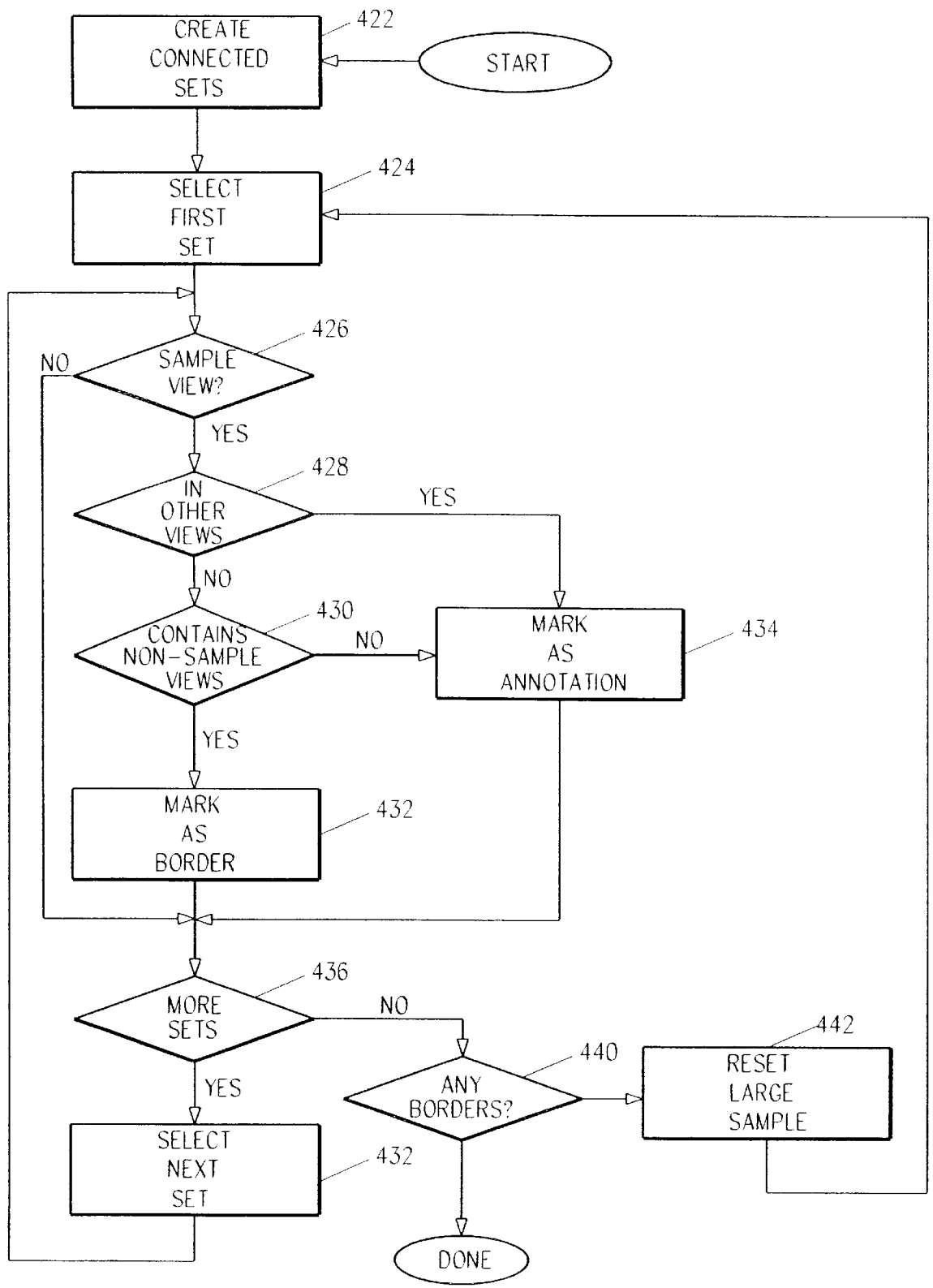
FIG. 26 is a flow chart illustrating steps performed in connection with detecting border views.

Referring to FIG. 26, a flow chart 420 illustrates steps performed in connection with the separate view step 326 of FIG. 22. At a first step 422, connected sets are created. A connected set corresponds to a portion of the intersection graph having a plurality of interconnected nodes that are not connected with any other nodes of any other connected set. Creating the connected sets at the step 422 is discussed in more detail hereinafter.

Following step 422 is a step 424 where the first connected set is selected for processing. Following the step 424 is a test step 426 where it is determined if the connected set being processed corresponds to a simple view. Whether a connected set corresponds to a simple view at the test step 426 is determined by first calculating a value called "large tolerance" which is equal to the sum of the height of the tallest object in the drawing and the width of the widest object in the drawing divided by one hundred and fifty. A view is considered a simple view if the area covered by the view is less than nine times the square of the value of large tolerance and if the view contains fewer than six elements.

If it is determined at the test step 426 that the connected set being examined is a simple view, then control passes from the test step 426 to another test step 428 where it is determined if the view being examined is contained in any other views. The determination at the step 428 may be made in a straight forward manner familiar to one of ordinary skill in the art. One technique for determining if view A is contained in view B is to first determine if a polygon that bounds view A does not intersect a polygon that bounds view B and if the area of the polygon of view A is less than the area of the polygon of view B. If both are true, then a ray is cast from any point in A. If the ray intersects bounding lines of the polygon of B an odd number of times, then view A is contained in view B.

If it is determined at the test step 428 that the connected set being processed is not contained in any other views, then control passes from the test step 428 to a test step 430 where it is determined if the connected set being examined contains at least two other non-simple views (i.e., two other connected sets that are not simple views). If so, then control passes from the test step 430 to a step 432 where the connected set being examined is marked as a border. Note other tests for determining if a connected set is a border include determining if the connected set contains orthogonal lines, which may be part of a border.

If the connected set being examined does not contain at least two non-simple views at the step 430, then control passes from step 430 to step 434 where the connected set being examined is marked as annotation. Note that the step 434 is also reached if it is determined at the test step 428 that the connected set being examined is contained in other views. Following the step 432 is a test step 436 where it is determined if more connected sets are to be processed. If so, then control passes from the test step 436 to a step 438 where the next connected set is selected for processing. Following step 438, control passes back to the test step 426 to examine the next connected set.

If it is determined at the test step 436 that there are no more connected sets to be processed, then control passes from the test step 436 to a test step 440 where it is determined if any borders have been detected. If at least one of the connected sets corresponds to a border, then processing is complete. Otherwise, if it is determined at the test step 440 that no borders have been detected, then control passes from the test step 440 to a step 442 where the value of large tolerance, discussed above in connection with step 426, is reset to the sum of the height and the width of the bounding box of the entire drawing divided by 150. Following the step 442, control passes back to the step 424 where the analysis is redone using the new value of large tolerance, to see if any borders are detectable given the recalculated value of large tolerance. Note that, in the case of redoing the analysis, the test at the step 440 may be skipped on the second pass.

Figure 27:
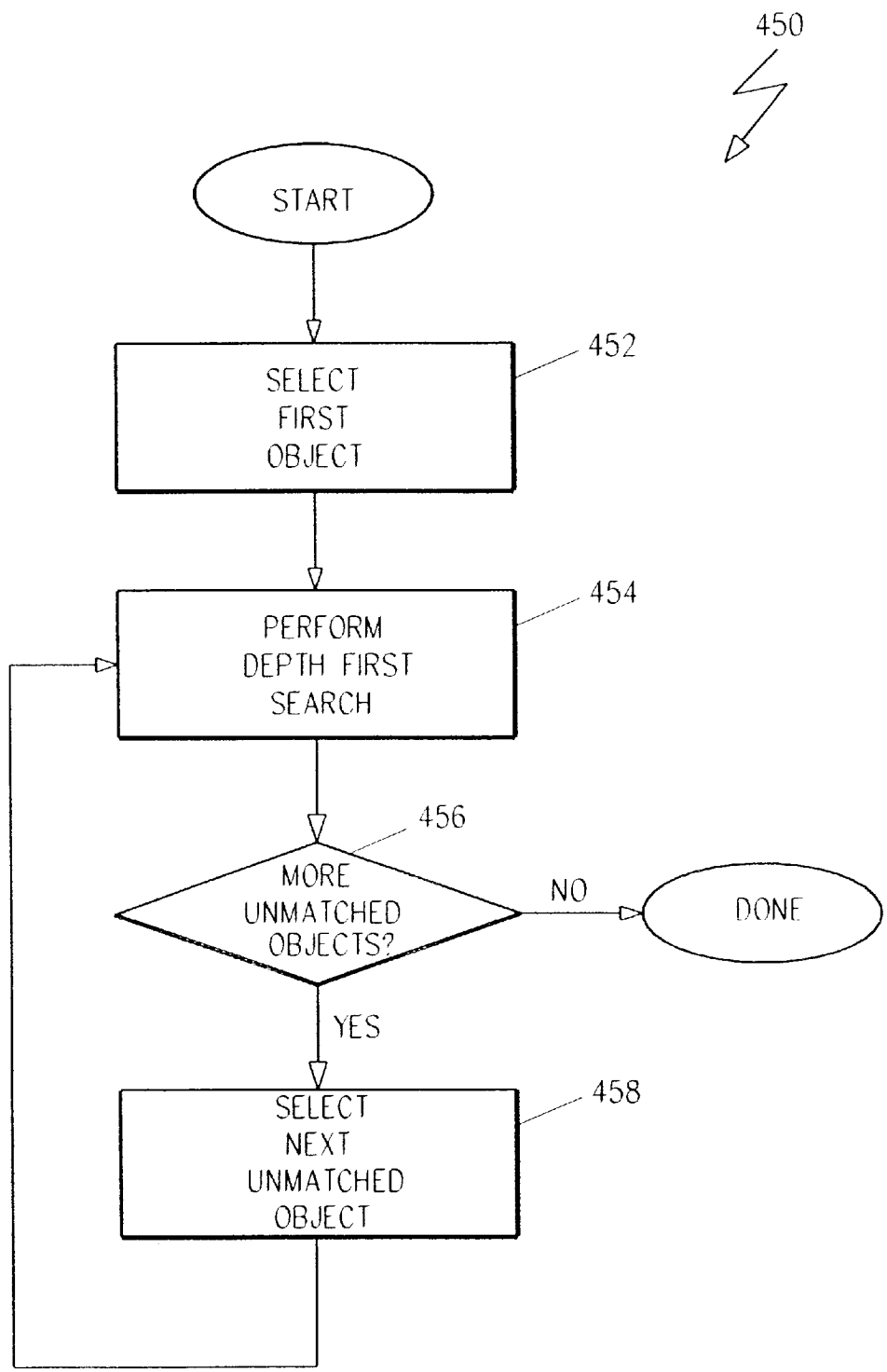
FIG. 27 is a flow chart illustrating steps performed in connection with constructing connected sets.

Referring to FIG. 27, a flow chart 450 illustrates operations performed in connection with the step 422 of FIG. 26 for creating the connected sets. Processing begins at a first step 452 where the first object from the generic data structure is selected. Following step 452 is a step 454 where a depth first search is performed on the intersection graph where objects that are connected to the first object either directly or through other objects are marked as being part of the same connected set. Following the step 454 is a test step 456 where it is determined if there are any objects in the generic data structure that have not been marked as being part of a connected set. If there are no objects that are not part of a connected set, then processing is complete. Otherwise, control passes from the step 456 to step 458 where the next unmatched object (I.e. object that does not correspond to any connected set) is selected for processing. Following this step 458, control passes back to the step 454.

Figure 28:
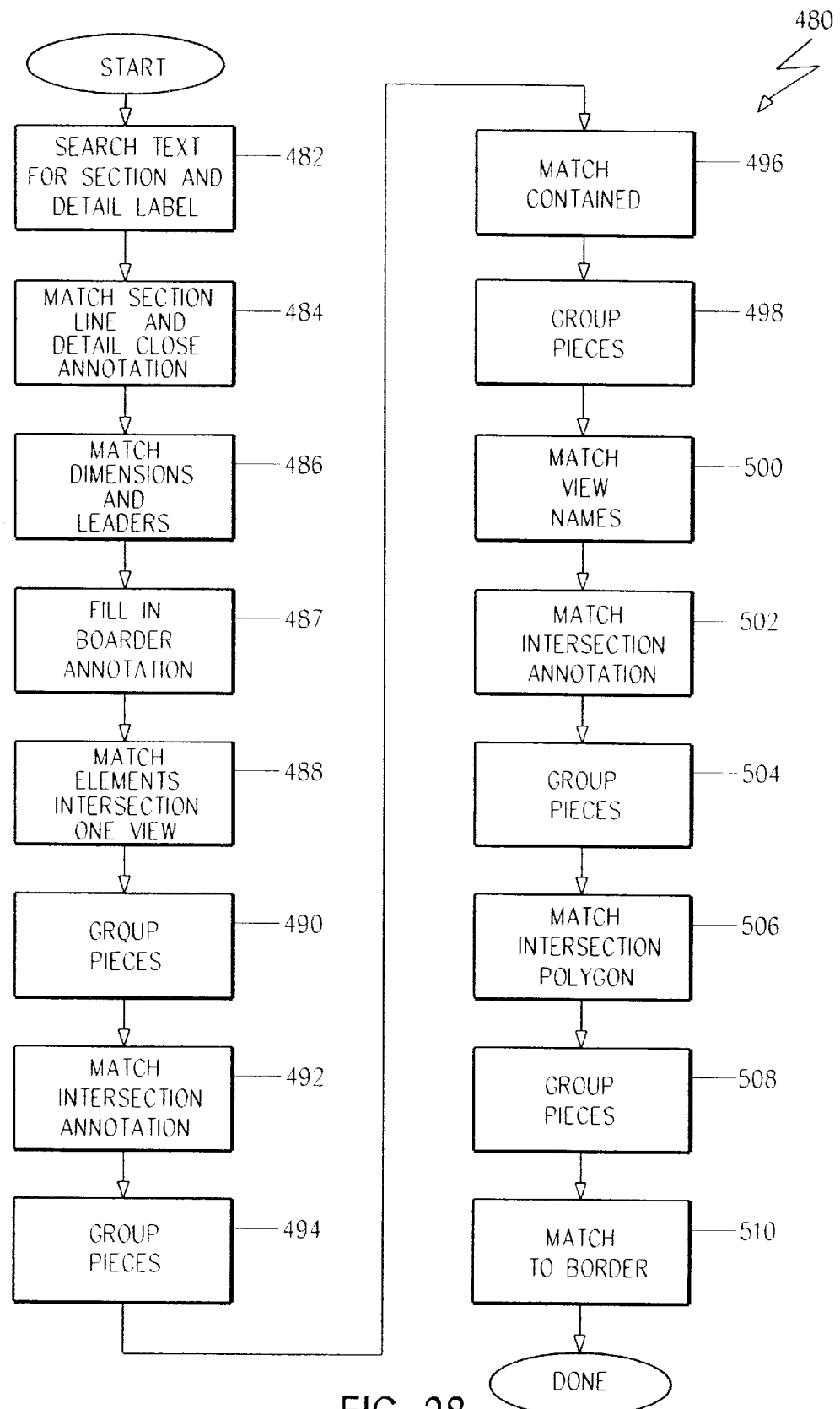
FIG. 28 is a flow chart illustrating steps performed in connection with matching annotation.

Referring to FIG. 28, a flow chart 480 illustrates the view name search step 228 and the match annotation step 330 from the flow chart 320 of FIG. 22. Matching the annotation involves examining the geometry marked at the separate geometry step 324 and associating the marked geometry with particular views of the drawing.

Processing begins at first step 482 where the text is searched for section line and detail circle labels. The section line and detail circle labels are used by follow on processing in a manner discussed below. Detecting section line and detail circle labels involves looking for text that contains the word "section", "section line", "Sec.," or any other text that may be used in connection with identifying a section line or detail circle on the drawing. Note that, in some embodiments, multi-lingual equivalents of terms may be searched for. Also, the text is examined for strings that are in the nature of two letters separated by a dash, such as "A—A". In this example, the label would be deemed the letter "A". By way of example, any of the following would be recognized as a section labeled "A": "Section A", Sec. A, "Section View A—A", "Section View A", "A—A". In connection with processing the text to determine section labels, the capitalization of the text is ignored.

Following the step 482 is a step 484 where the section lines and detail circles are matched with particular views. A section line or detail circle corresponds to a particular view when the section line or detail circle passes through and is contained primarily in the view.

Following the step 484 is a step 486 where the dimensions and leaders annotation are matched to particular views. This is performed by using the critical point from the generic data structure (discussed above). For dimensions the critical points may be the ends of the dimension lines. For a leader, the critical point may be the location of the object to which the leader points.

Following the step 486 is a step 487 where any view that is marked as being a border (see discussion above) is broken up into pieces using orthogonal lines that make up the border to see if any annotation is contained entirely in one of the pieces formed by the lines. Note that the orthogonal lines of a border may contain smaller (usually rectangular) subareas that are part of the border. Any annotation that is contained in one of the subareas is matched with the border view.

Following the step 487 is a step 488 where it is determined if any of the annotation intersects a part from one of the views. Any annotation that meets this criteria is associated with the view. At the step 488, any annotation that intersects two or more parts from two or more different views is matched to a border.

Following step 488 is a step 490 where a group pieces function is performed. The group pieces function groups portions of arrows, section lines, detail circles, and corresponding text annotation together so that, for example, if a section line had been previously matched with a particular view, then any arrows and the text associated with the section line is grouped with the section line and thus matched with the same view. Similarly, if an arrowhead is matched with a view, the step 490 causes the remainder of the arrow (i.e., the stem) to be associated with the same view. Following the step 490 is a step 492 where annotation that intersects a graphic element of a particular view is then matched with the particular view.

Following the step 492 is a step 494 where the group pieces function, discussed above in connection with the step 490, is performed again. Following the step 494 is a step 496 where a match contained function is performed. The match contained function matches annotation with any view in which the bounding polygon thereof contains the entirety of the annotation. Following the step 496 is a step 498 where the group pieces function, discussed above in connection with the step 490, is performed again.

Following the step 498 is a step 500 where view names are matched with particular views. The view names are detected in the step 482, as discussed above, and may correspond to, for example, names of particular sections and detail circles. The view names are matched by first matching any view name text that intersects a view and then calculating an average vector from the center of the matched views to the corresponding text. Then, any unmatched view names are matched with views using the vector to determine a most likely match based on the relative displacement of "known" view name text to view matches.

Following the step 500 is a step 502 where any unmatched annotation is matched by seeing if the unmatched annotation intersects any of the parts of any of the views or any of the annotation that has been previously matched to any of the views. The step 502 is analogous to the step 492 except that, prior to testing for intersection, convex hulls associated with any unmatched annotation is swelled to a value corresponding to medium tolerance, where the value of medium tolerance is set to 60% of the value of large tolerance. Following the step 502 is a step 504 where the group pieces function, discussed above in connection with the step 490, is performed again.

Following the step 504 is a step 506 where annotation that intersects a bounding polygon of a view is matched with the view. Following the step 506 is a step 508 where the group pieces function, discussed above in connection with the step 490, is performed again.

Following the step 508 is a step 510 where the remaining annotation that has not been matched is matched with a particular border. The annotation that matches with a particular border may include, for example, a title given to the entire drawing. Following the step 510, processing is complete.

Figure 29:
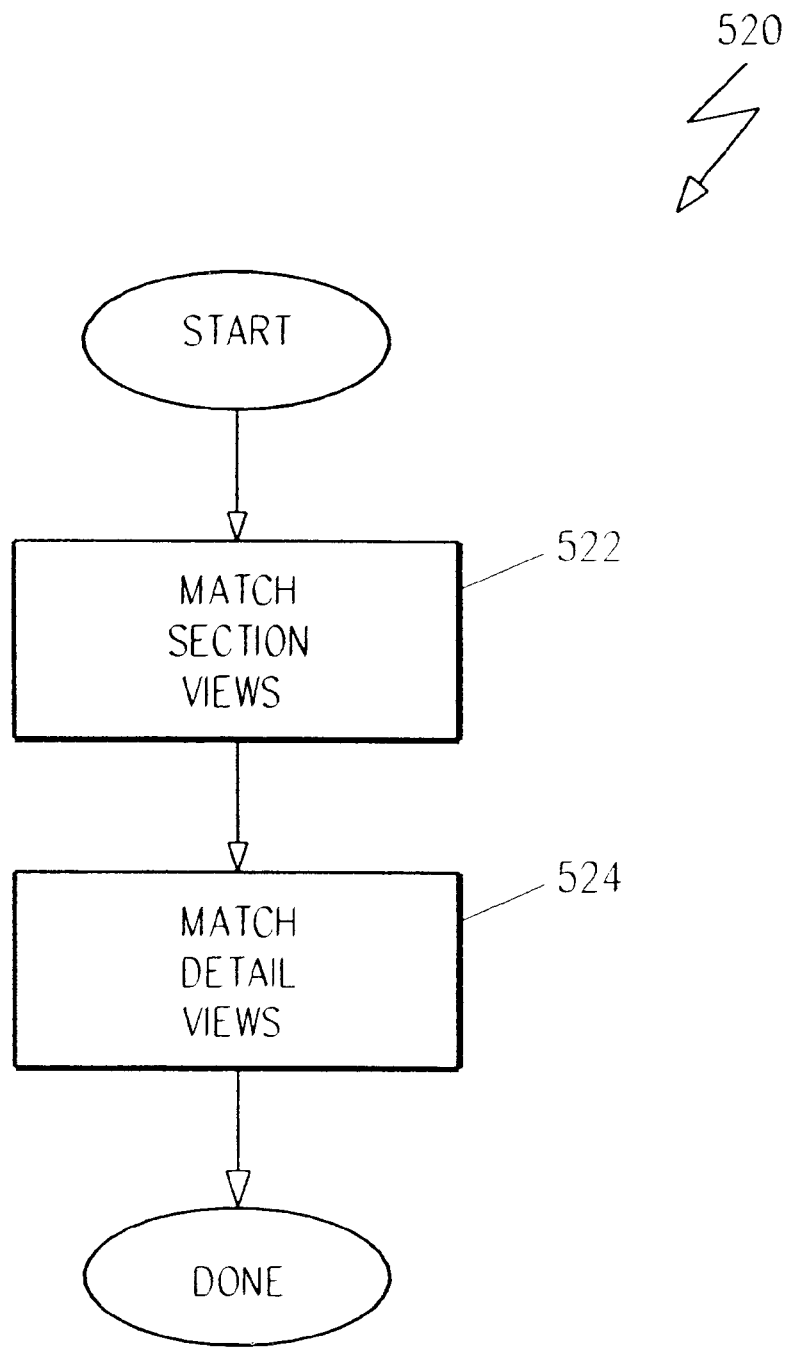
FIG. 29 is a flow chart illustrating steps performed in connection with view type guessing.

Referring to FIG. 29, a flow chart 520, illustrates steps performed in connection with the guess view type step 332 set forth in the flow chart 320 of FIG. 22. Processing begins at a first step 522 where views having section names (detected as discussed above) are labeled section views. Following the step 522 is a step 524 where views having detail circle names are marked as detail circle views. Following the step 524, processing is complete.

Figure 30:
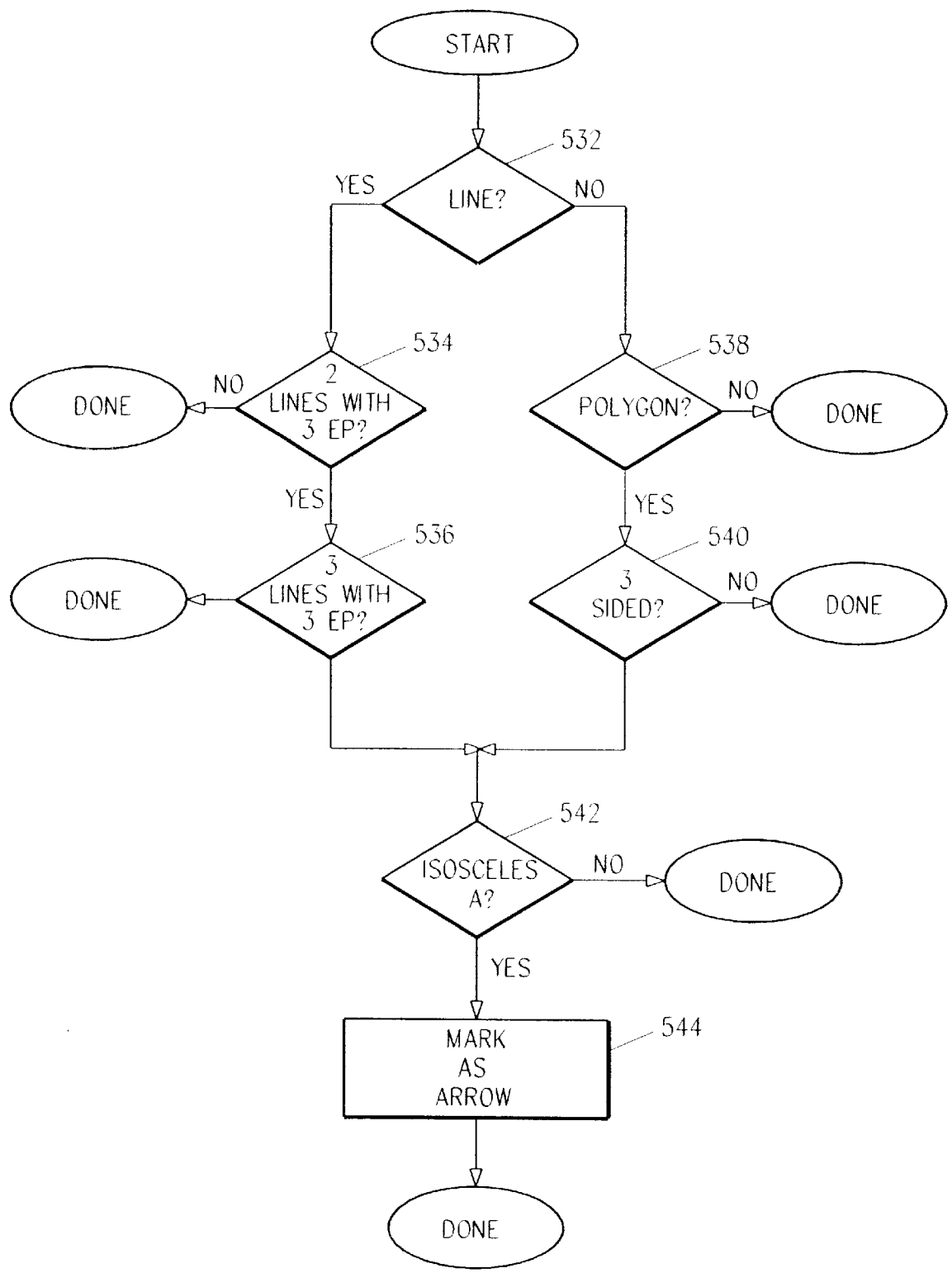
FIG. 30 is a flow chart illustrating steps performed in connection with detecting arrow heads.

Referring to FIG. 30, a flow chart 530 indicates steps performed in connection with detecting arrowheads. The flow chart 530 represents steps that are performed on each object of the generic data structure that is examined and processed. The flow chart 530 does not include the iteration steps, which are illustrated above in connection with other ones of the flow charts.

Processing begins at a test step 532 which determines if the object being examined is a line. If so, then control passes from the step 532 to a step 534 where it is determined if the line object being examined, along with another line object, have between them three endpoints, where one of the endpoints is common, i.e. the lines touch at their ends. If not, then the two lines being examined are not part of an arrowhead and processing is complete. Note that the step 534 may represent iterating through all of the other line objects to test for three end points.

If two lines having three end points are found at the step 534, the control passes from the step 534 to a step 536 where it is determined if there are three lines (the two lines tested at the step 534 and a new, third, line) that have a total of three end points in common. Three lines with three common end points form a triangle. If there are not three lines with three common end points, then processing is complete.

If it is determined at the step 532 that the object being processed is not a line, then control passes from the step 532 to a step 538 where it is determined if the object being processed is a polygon. If not, then processing is complete. Otherwise, control passes from the step 538 to a step 540 where it is determined if the polygon is a three sided polygon. If not, then processing is complete. Otherwise, control passes to a test step 542, which also follows the step 536 if three lines are determined to form a triangle.

At the test step 542, it is determined if the three sided polygon (if the step 542 is reached via the step 540) or the three lines (if the step 542 is reached from the step 536) form an isosceles triangle (a triangle with two equal sides) where the third, unequal side, is shorter than the other two sides. If not, then processing is complete. Otherwise, control passes to a step 544 where the object(s) are marked as an arrowhead. Note that, in the case of a half arrowhead, it may be possible at the step 542 to first detect a right triangle and then determine whether the short side is less than one half the length of the hypotenuse.

Figure 31:
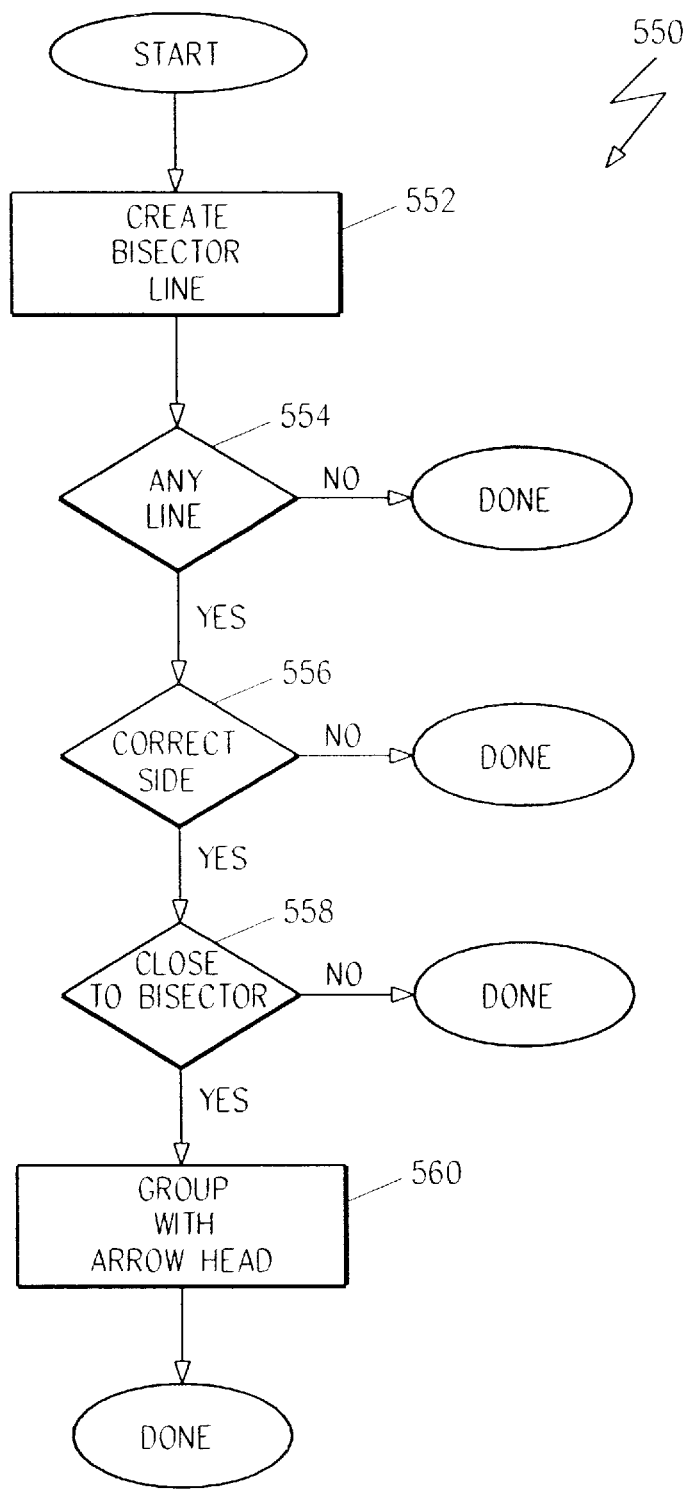
FIG. 31 is a flow chart illustrating steps performed in connection with detecting stems of linear arrows.

Referring to FIG. 31, a flow chart 550 illustrates steps performed in connection with the determining if three line have a total of three end point step 536 of FIG. 30. Processing begins at a step 552 where an imaginary bisector line is calculated. The imaginary bisector line extends from the tip of the arrowhead (the part of the arrowhead where the two lines of equal length meet) through the middle of the third line. Note that, in the case of a half arrowhead (I.e.: right triangle), the imaginary bisector line extends from the tip of the arrowhead along the longer of the legs of the right triangle.

Following step 552 is a step 554 where it is determined if there is any line in the generic data structure that touches the arrowhead. If not, then processing is complete. Otherwise, control passes to a test step 556 where it is determined if the line that touches the arrowhead (detected at the step 554) is on the correct side of the arrowhead (i.e., extends from the tip of the arrowhead in the same direction as the imaginary bisector line calculated at the step 552). If the line that touches is not on the correct side of the tip of the arrowhead, then processing is complete. Otherwise, control passes from the step 556 to a test step 558 where it is determined, using conventional means, if the line that touches is close to the imaginary bisector line. If not, processing is complete. Otherwise, control passes from the test step 558 to a step 560 where the line that touches is marked as the stem of the arrow and is grouped with the remaining parts of the arrow. Grouping the parts of the arrowhead affects the annotation match process, as discussed above.

Figure 32:
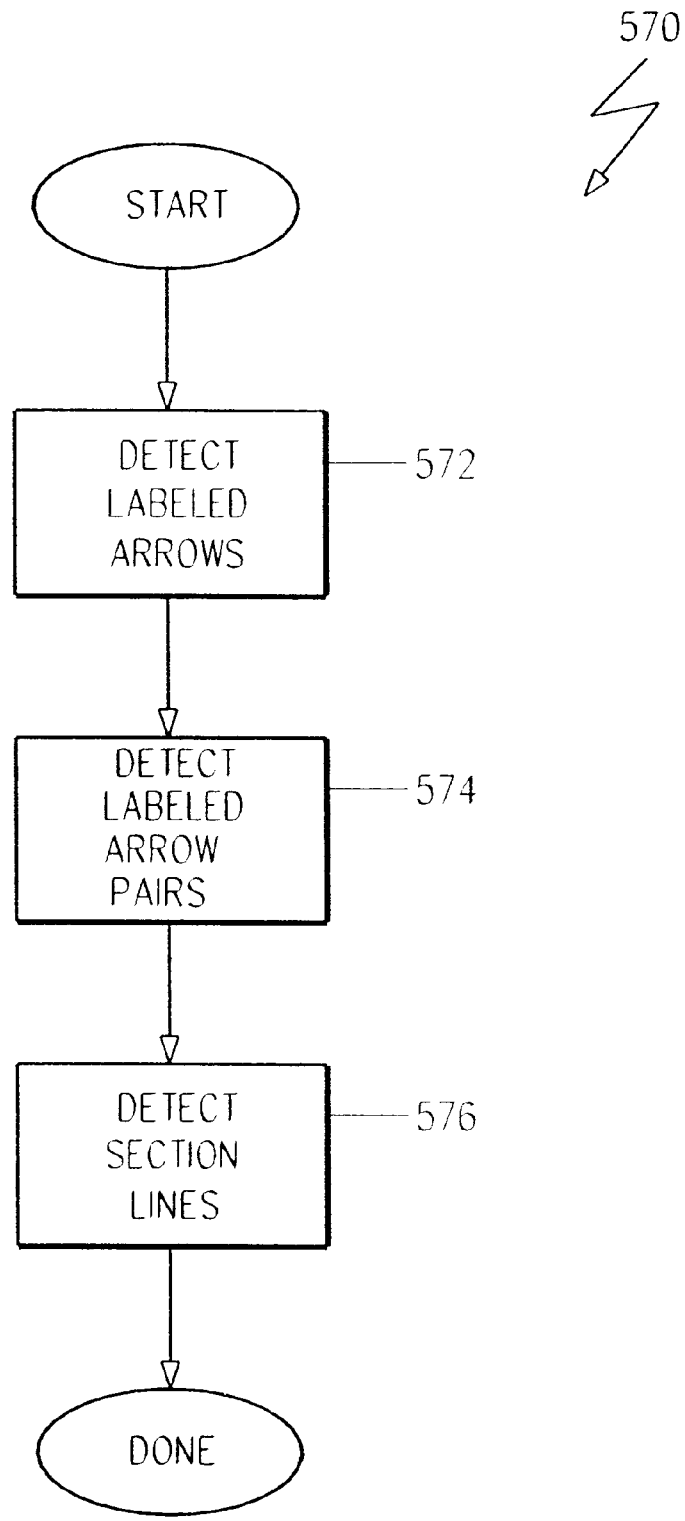
FIG. 32 is a flow chart illustrating steps performed in connection with detecting labels for linear arrows, detecting pairs of labeled arrows, and detecting section lines.
Figure 1:
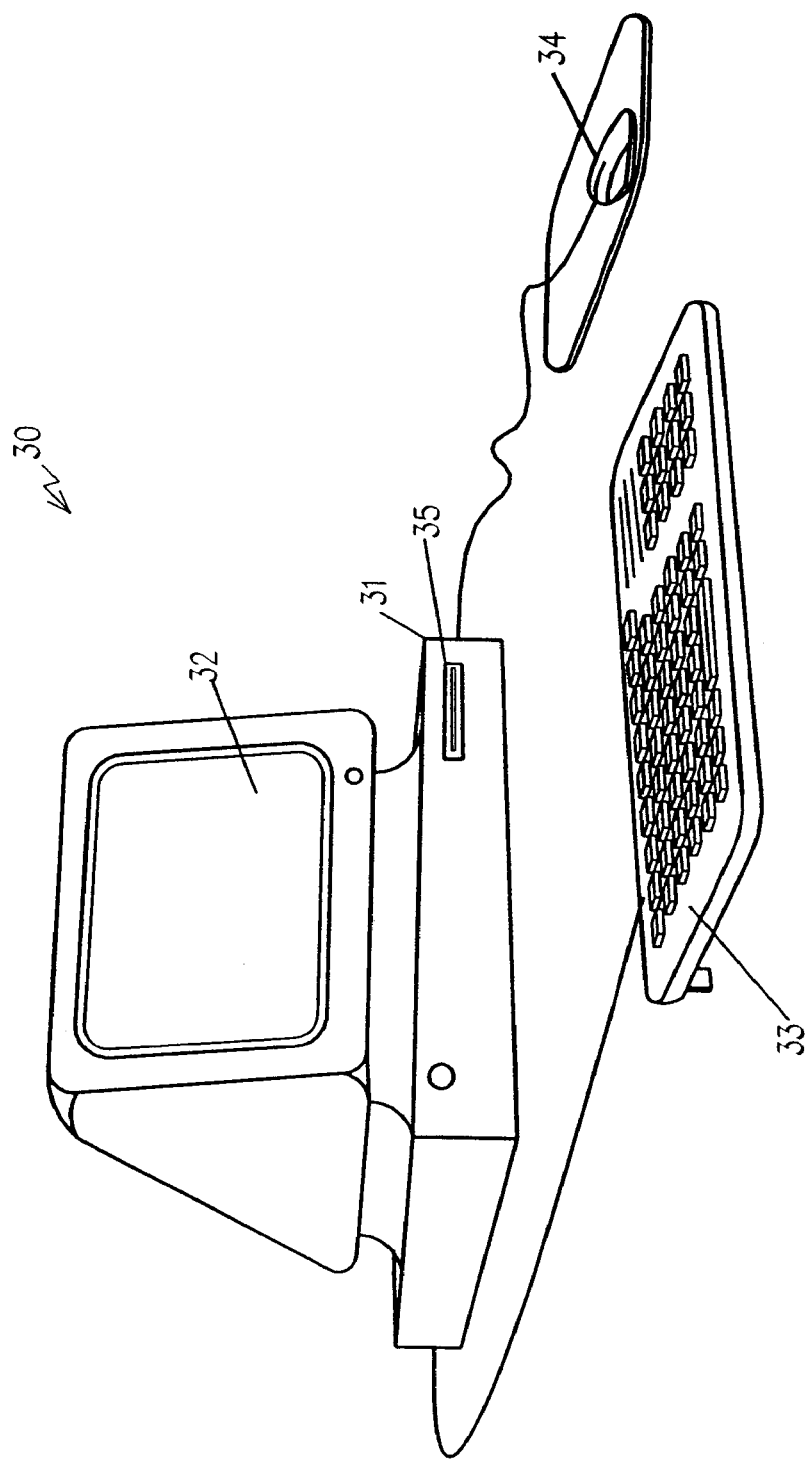
Figure 2:
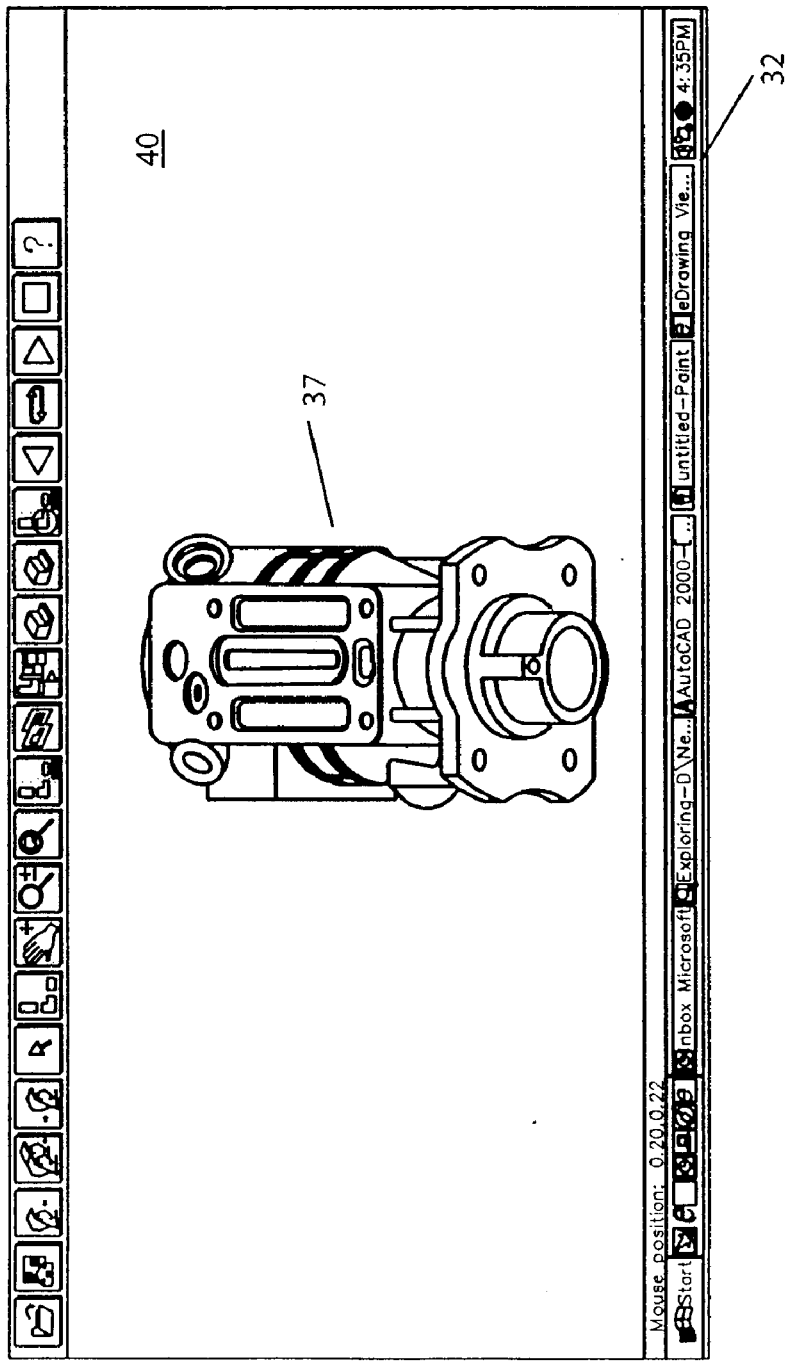
Figure 3:
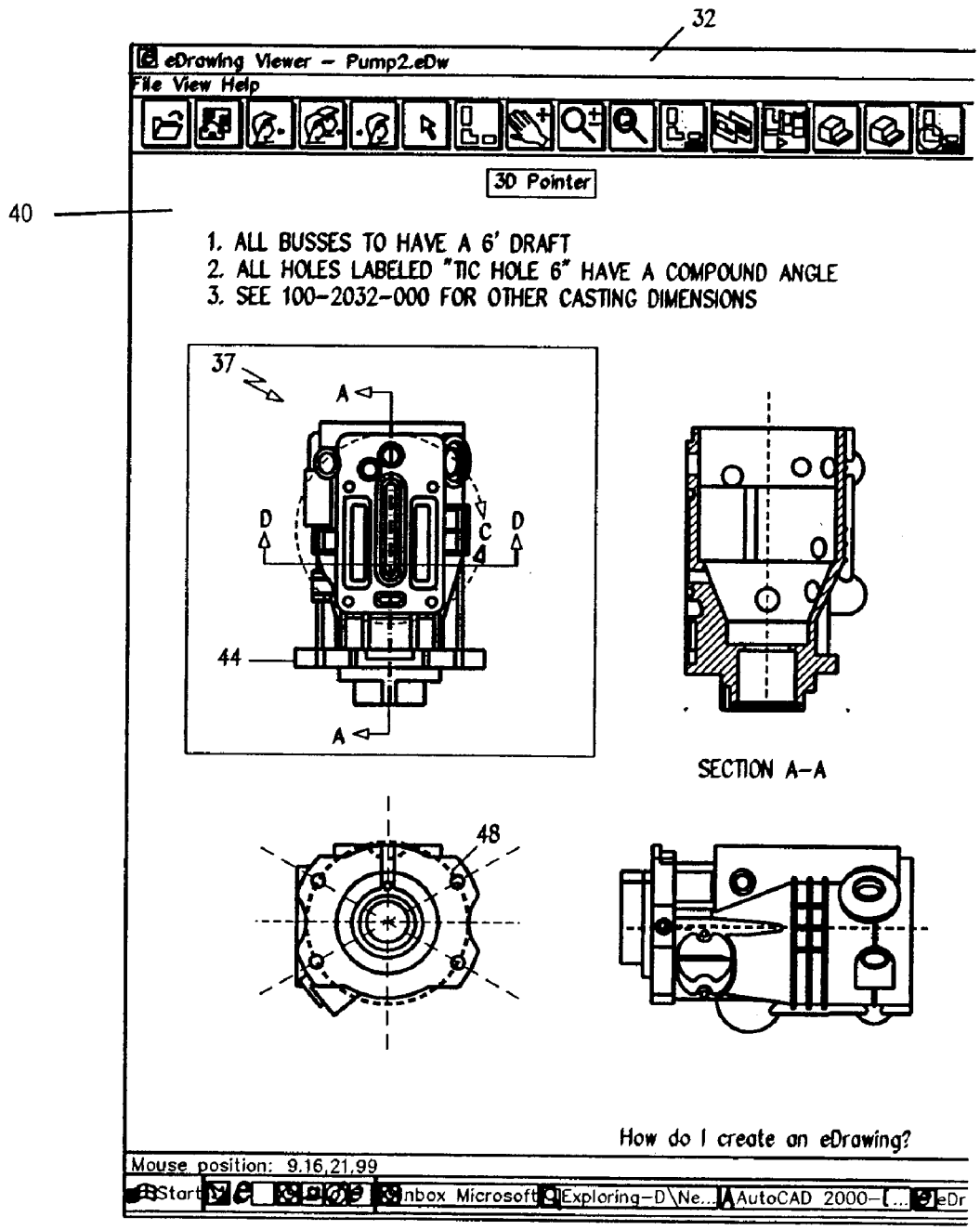
Figure 5:
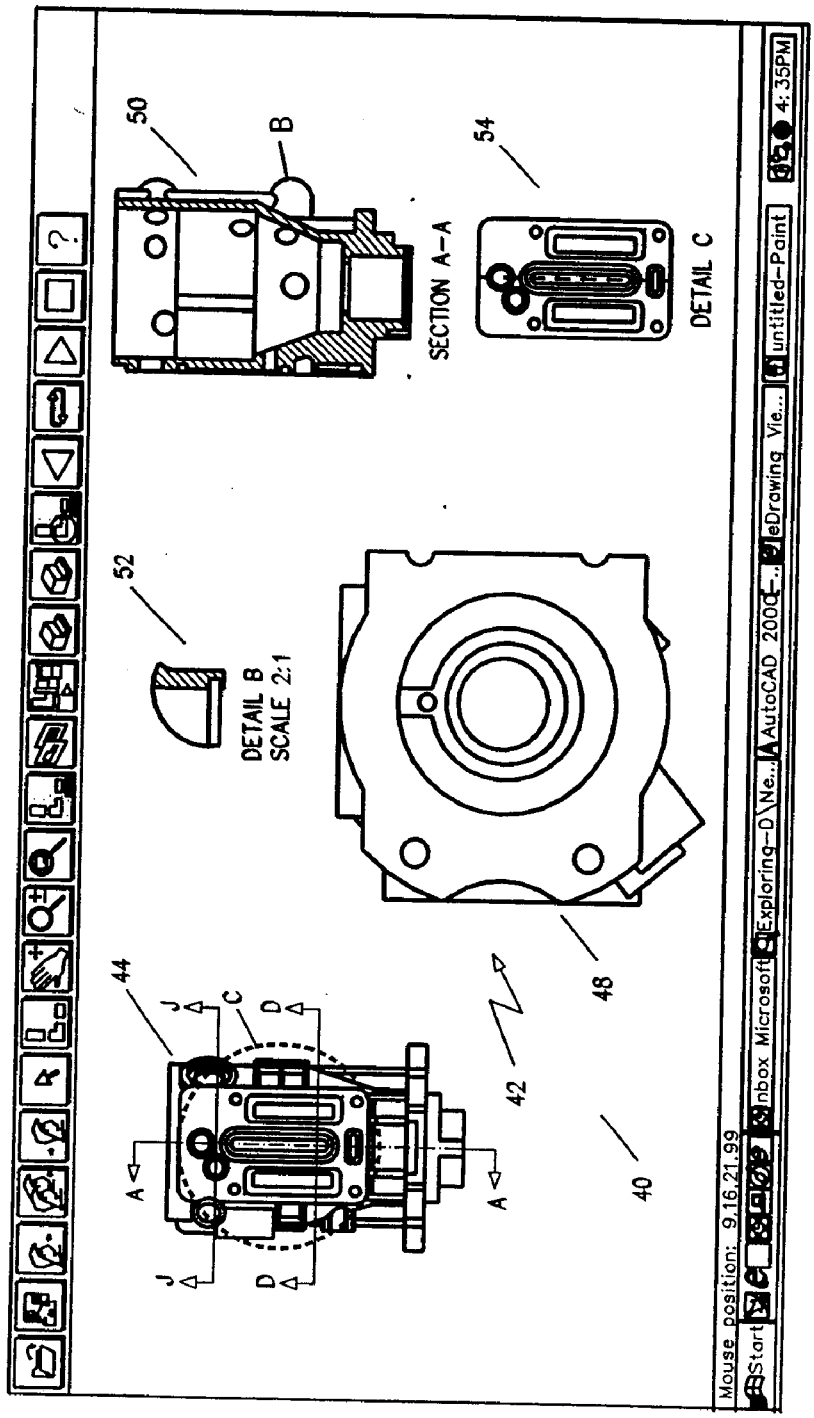
Figure 7:
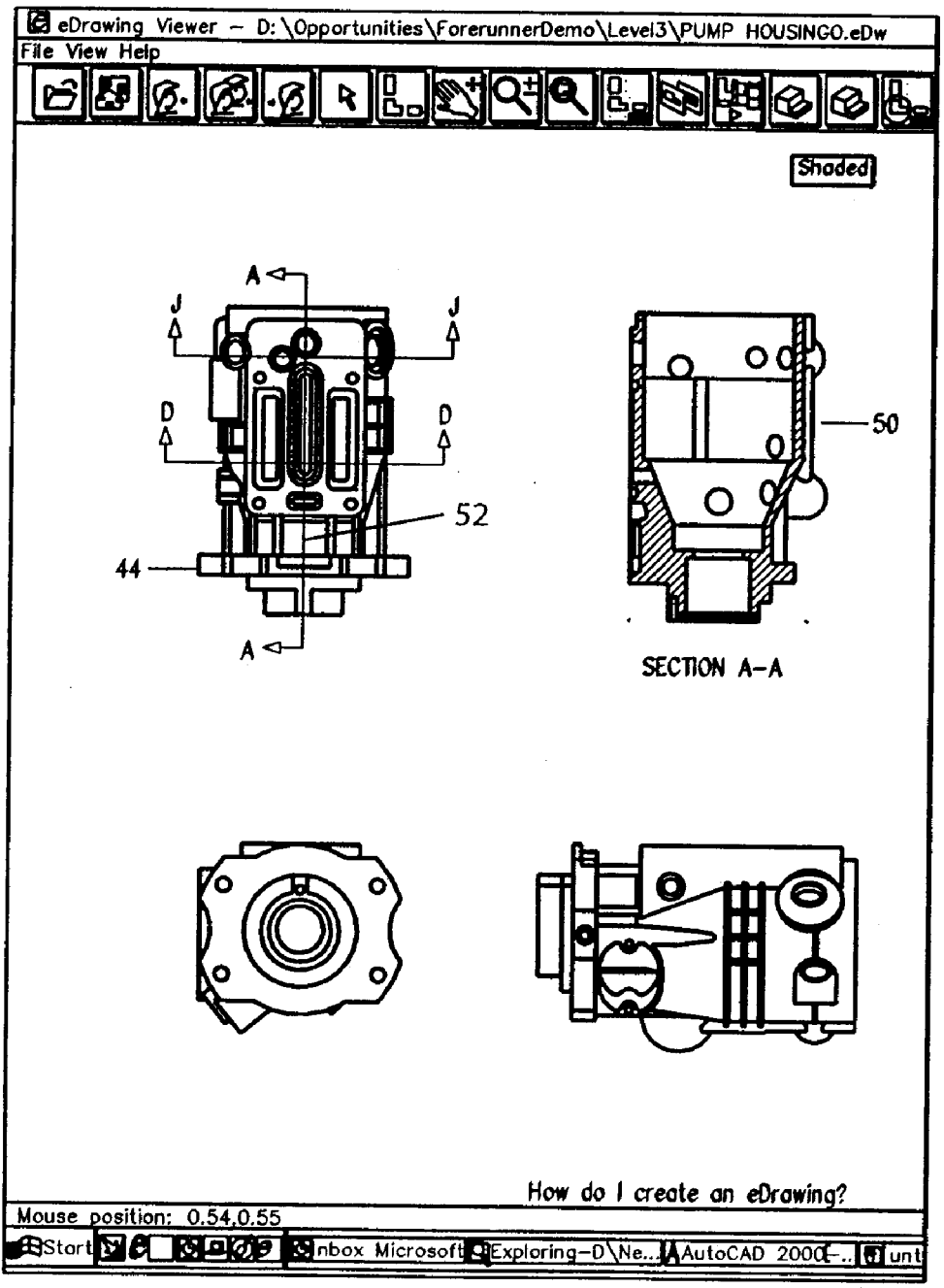
Figure 8:
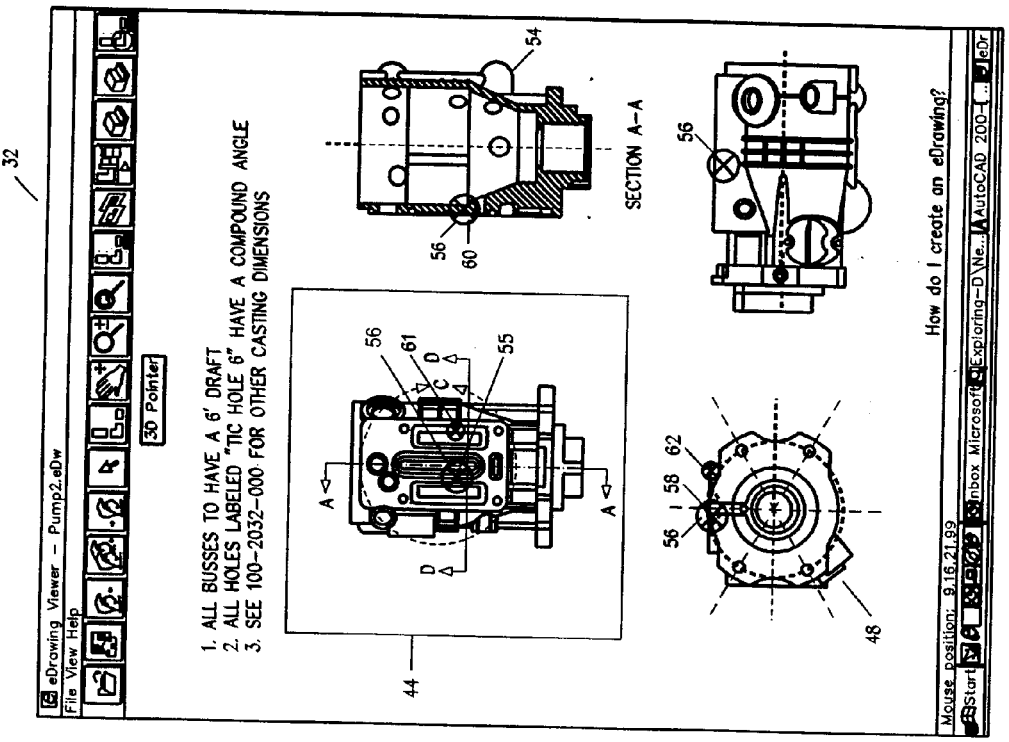
Figure 14:
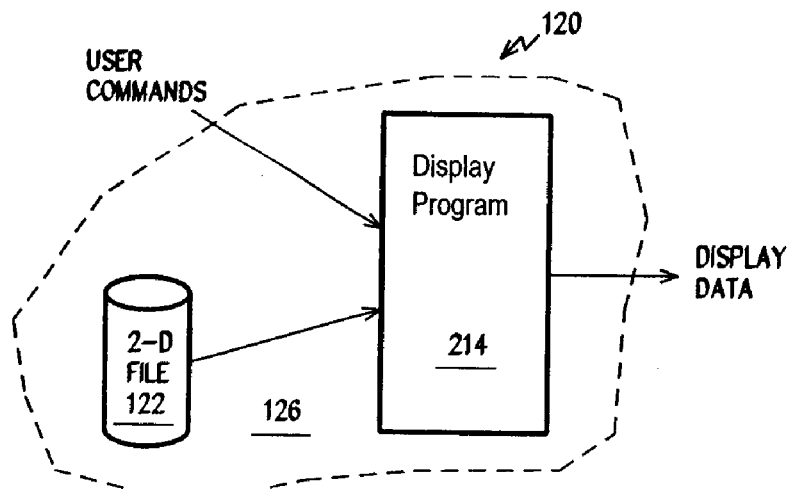
Figure 15:
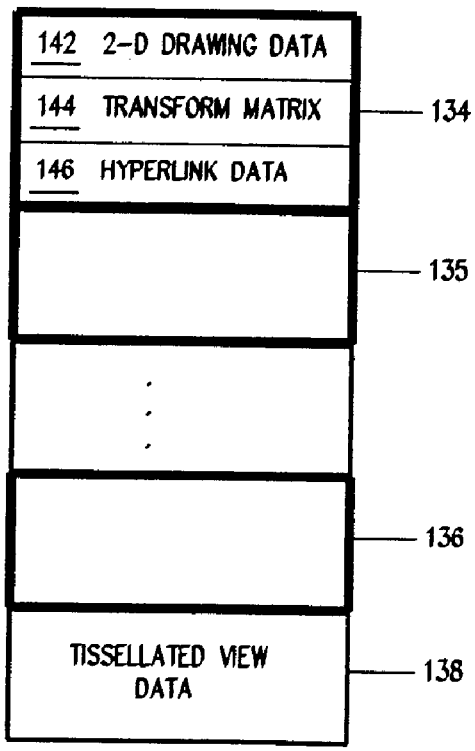
Figure 16:
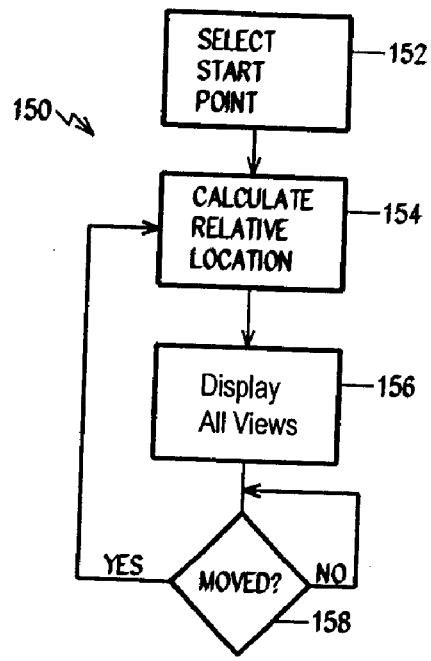
Figure 17:
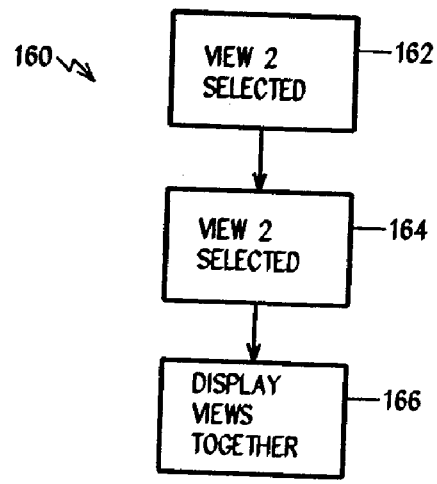
Figure 18:
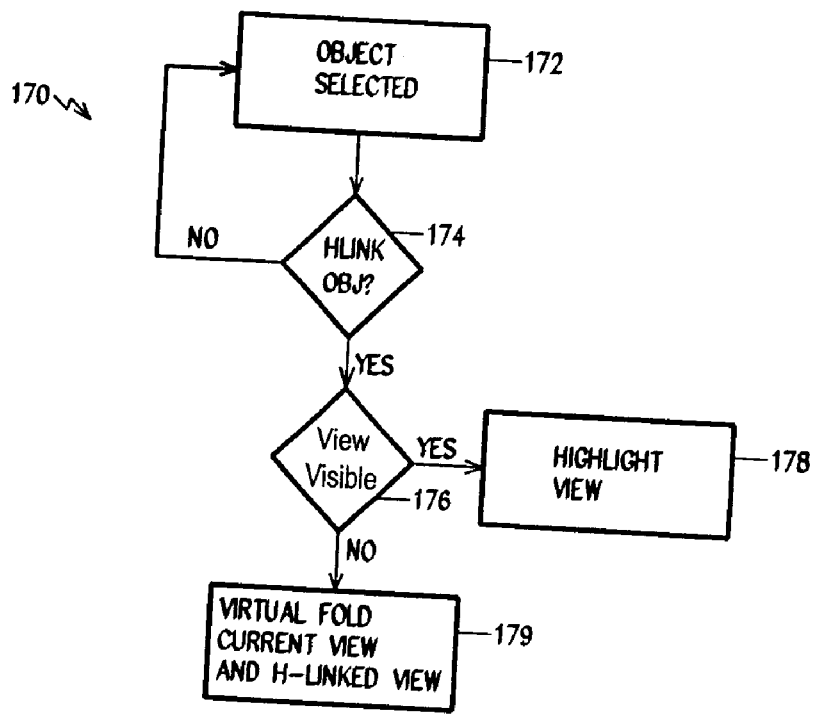
Figure 20:
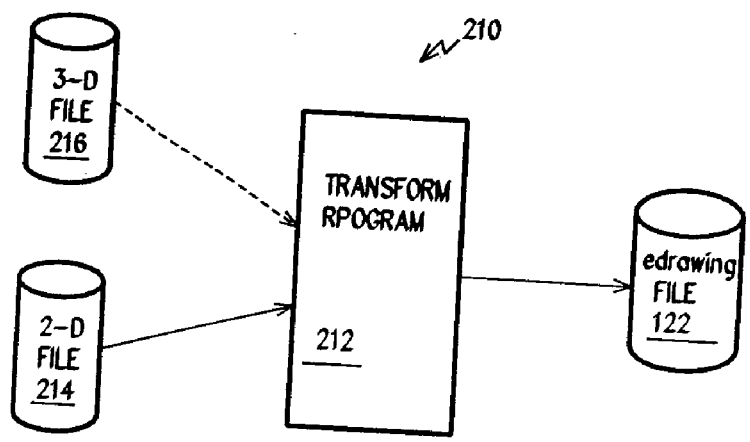
Figure 19:
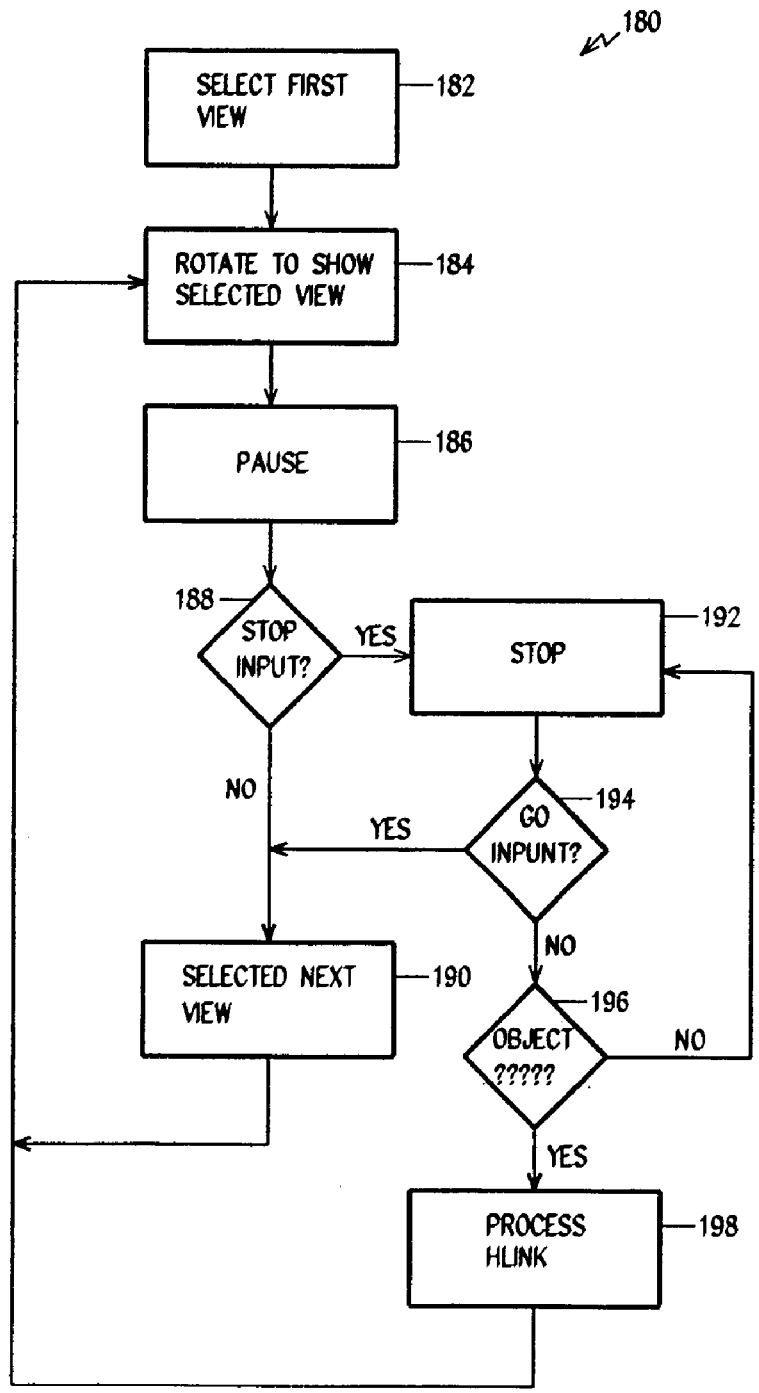
Figure 23:
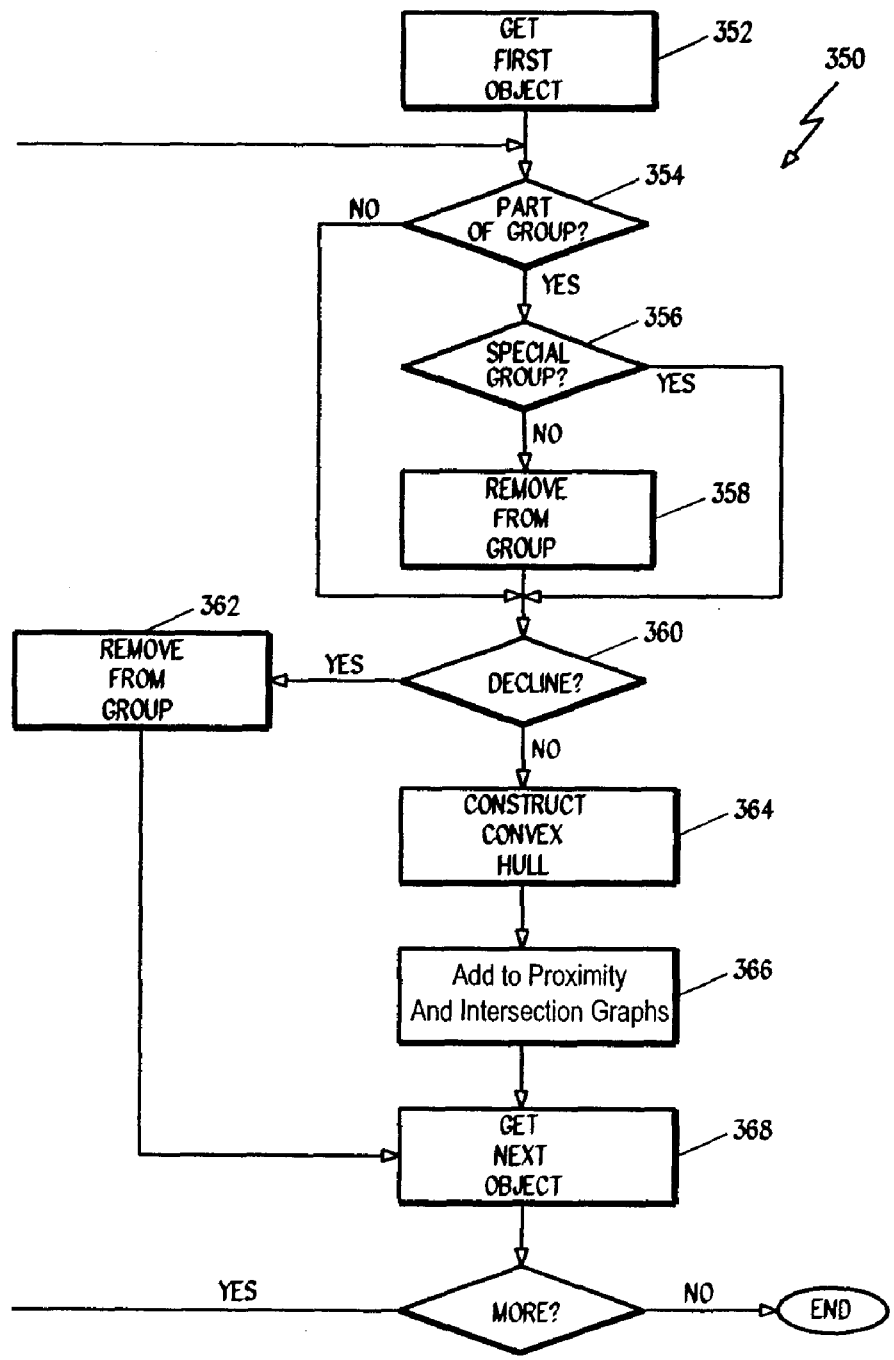
Figure 24:
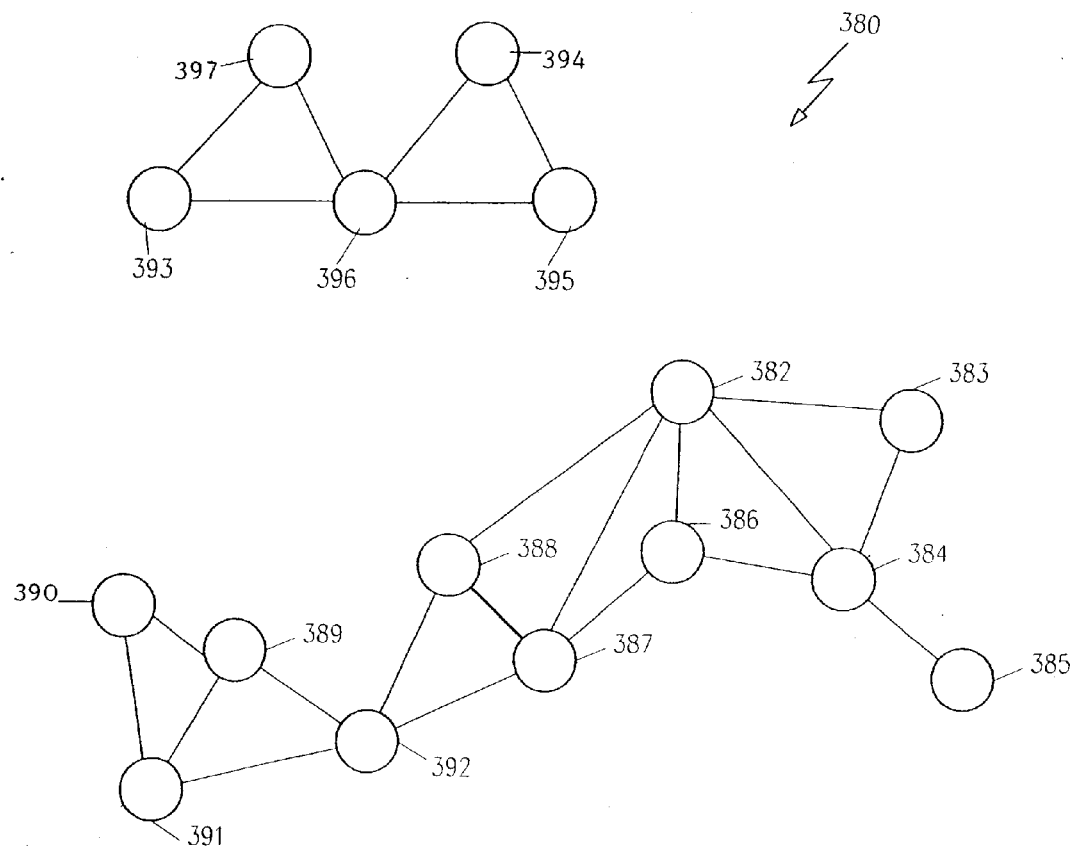
Figure 26:
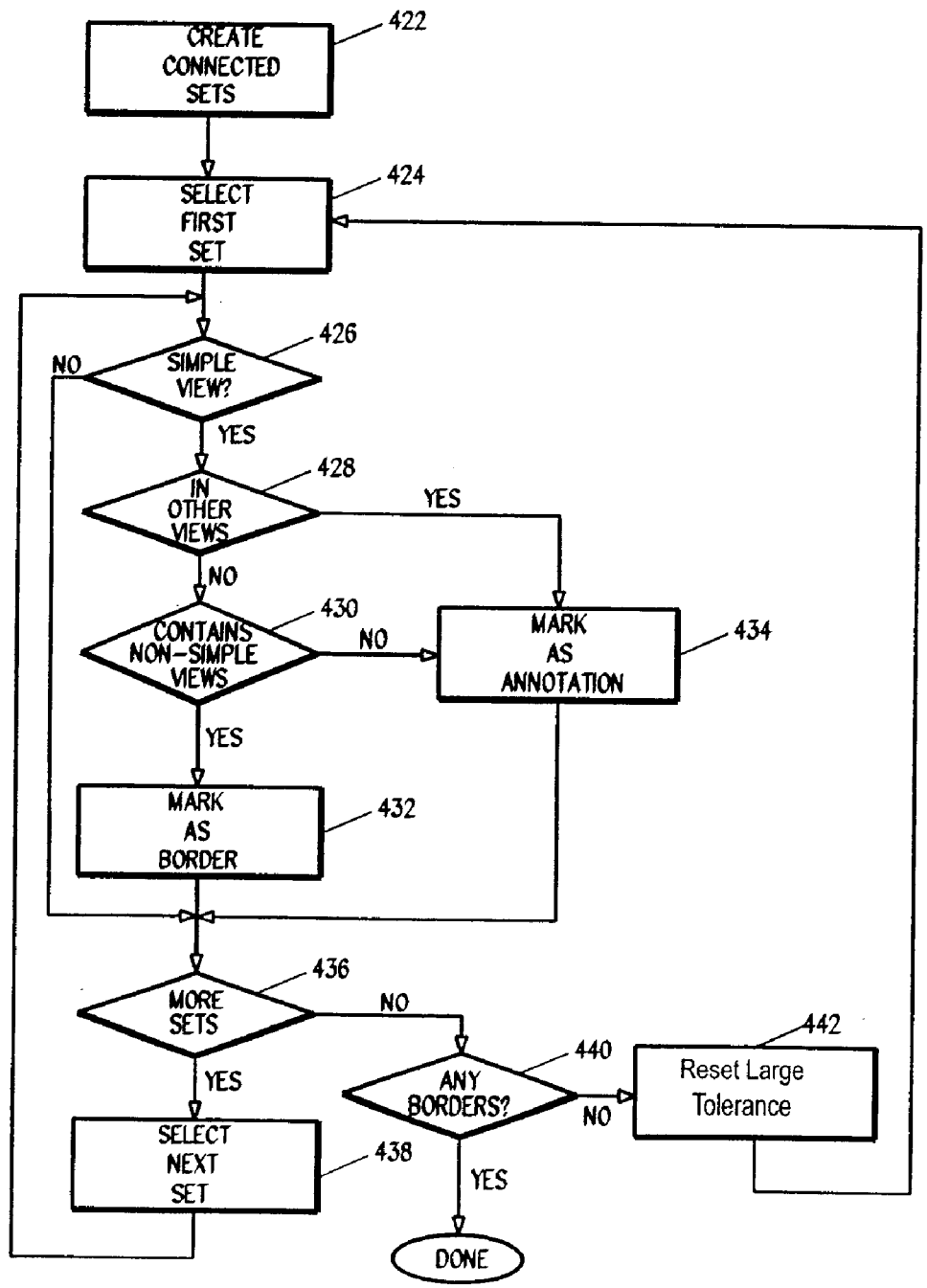
Figure 28:
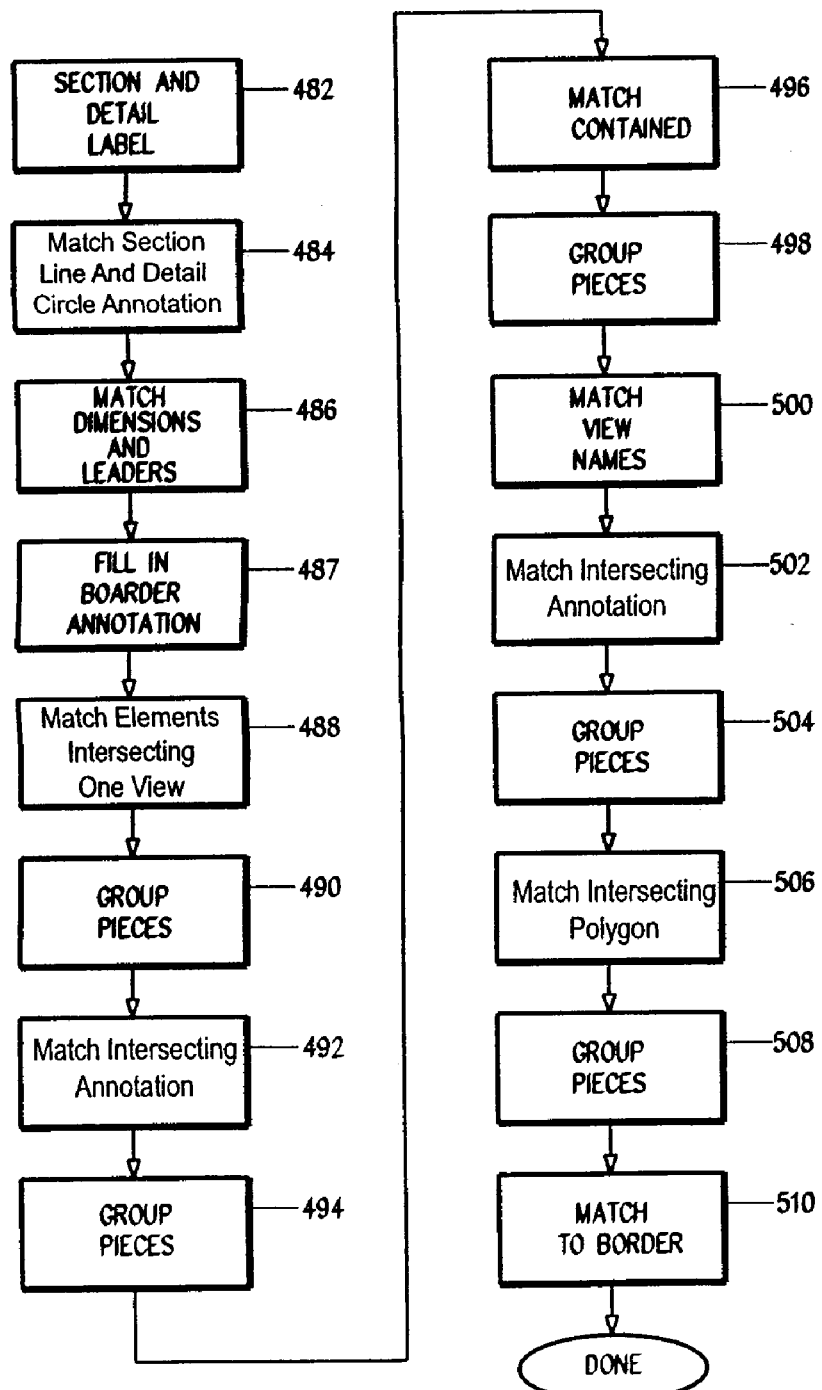

Referring to FIG. 32, a flow chart 570 illustrates other steps performed in connection with processing annotation.

At a first step 572 labels associated with the linear arrows are detected. At the step 572, any text that is in proximity to a stem of a linear arrow is grouped with the arrow. Following the step 572 is a step 574 where linear arrow labeled pairs are detected. If two linear arrows have the same text label, the arrows are deemed a pair. Following the step 574 is a step 576 where section lines are detected by examining the linear arrow labeled pairs detected at the step 574 and deeming any pair with substantially parallel stems part of a section line.

The steps 572, 574, 576 of the flowchart 570 may be adapted to also detect detail circles. In that case, the step 572 would include looking for labeled arrow/arc combinations and the step 574 would detect labeled arcs having the same label. The step 576 would then include detecting when two labeled arcs correspond to the same arc.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

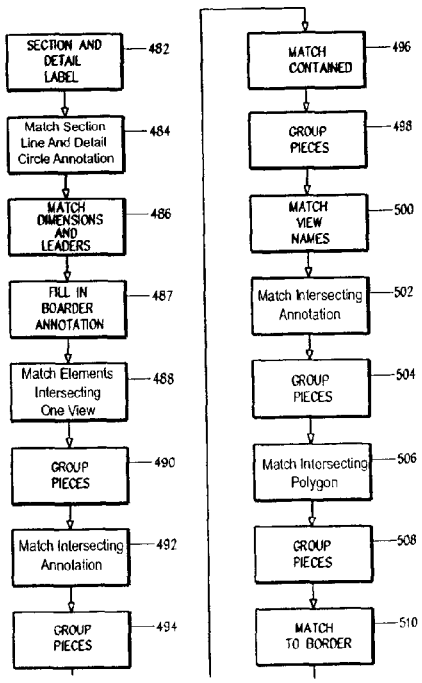

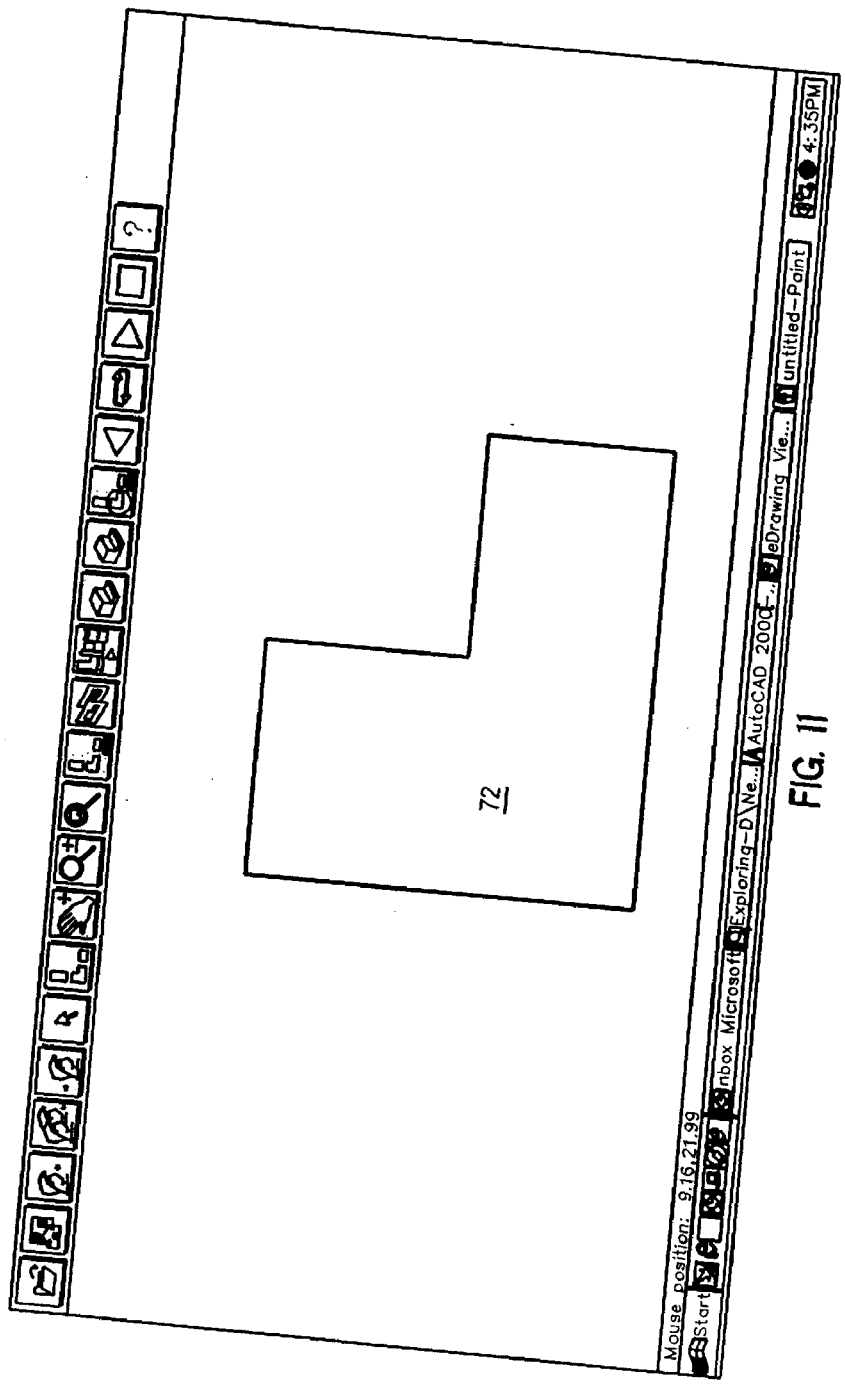

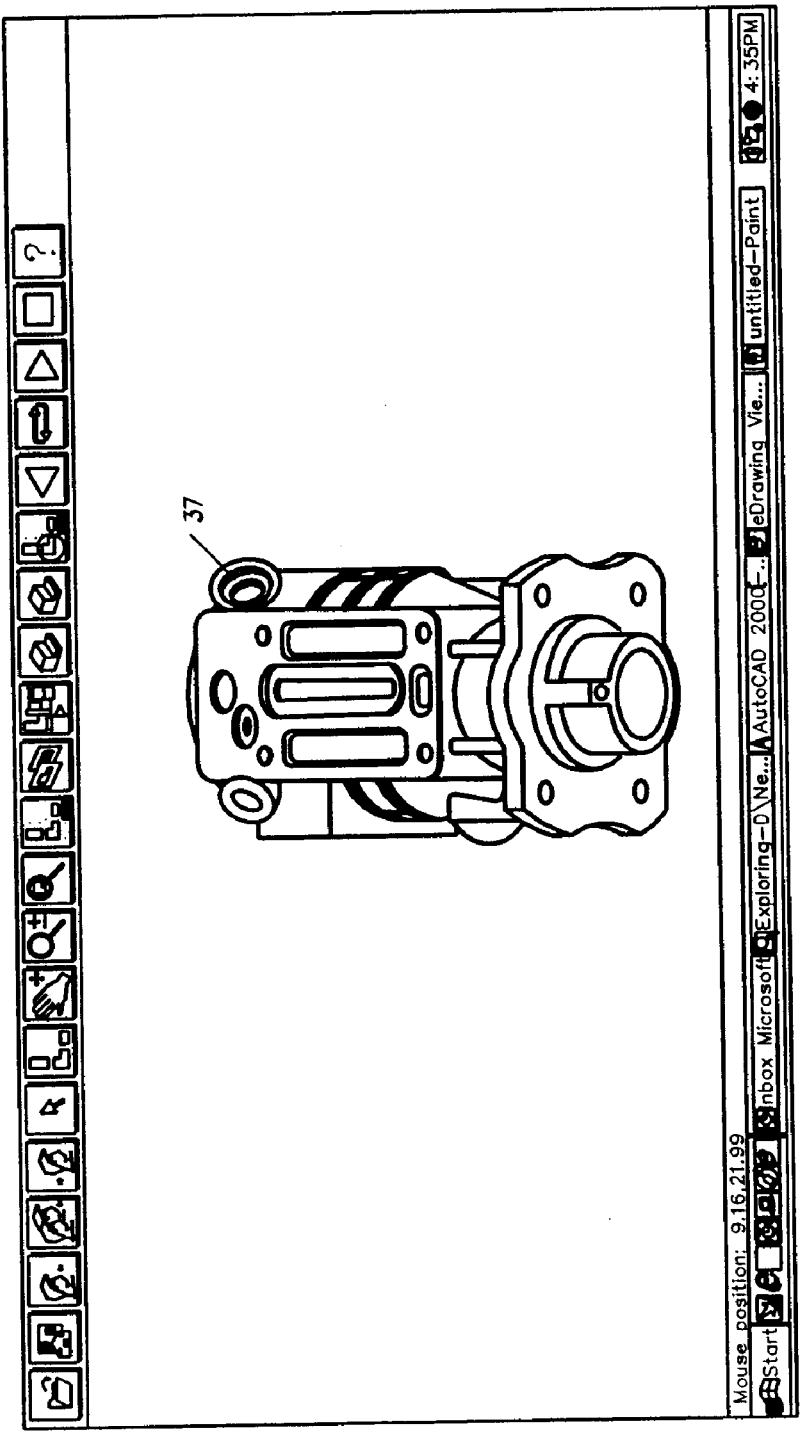

What is claimed is:

1. A computer-implemented method for processing two-dimensional drawing data, the method comprising:
   receiving two-dimensional drawing data comprising a plurality of data objects, said data objects comprising:
   2D drawing primitives providing for representation of a plurality of views of a modeled object, and
   at least one annotation object;
   reformatting the received two-dimensional drawing data into a generic format wherein the generic format comprises a generic data structure representing the plurality of views of the modeled object and at least one annotation object;
   processing the generic data structure to identify at least one of said annotation objects;
   separating the two-dimensional drawing into a plurality of views based on an analysis of relationships between ones of the 2D drawing primitives as represented in the generic data structure; and
   associating each of the identified annotation objects with a related one of the views.

2. The method of claim 1 wherein separating the drawing into a plurality of views comprises:
   constructing a plurality of graphs, each graph comprising a graph type selected from the group consisting of intersection and proximity graphs; and
   processing the graphs to identify a plurality of connected sets, wherein each connected set corresponds to one of the views.

3. The method of claim 2 further compromising:
   identifying border views by determining ones of the views that include less than a predetermined number of elements and contain at least two other views, and are not contained in other views.

4. The method of claim 1 wherein processing the generic data structure comprises identifying an annotation object comprising an object selected from the group consisting of an arrows, a section line, a detail circle, and text.

5. The method of claim 4 wherein identifying an arrow comprises an operation selected from the group consisting of:
   detecting three lines forming an isosceles triangle; and
   detecting a three-sided polygon forming an isosceles triangle.

6. The method of claim 5 wherein isosceles triangles and three-sided polygons corresponding to isosceles triangles are identified as arrows if a side having a different length than two other sides is shorter than the two other sides.

7. The method of claim 1 wherein processing the generic data structure comprises removing degenerate objects.

8. A computer-implemented method for converting a two-dimensional file, representing a two-dimensional drawing, into an electronic drawing file, the method comprising the steps of:
   receiving the two-dimensional file said file comprising a plurality of different views of a same modeled object, each view being represented by a plurality of graphical primitive objects;
   reformatting the two-dimensional file into a generic file format comprising a generic data structure describing the plurality of graphical primitive objects;
   interpreting the content of the reformatted two-dimensional file, wherein the step of interpreting comprises:
   identifying the plurality of views of the modeled object;
   separating the views;
   associating at least one of the graphical primitive objects comprised in a first one of the views with a second one of the views;
   inserting a link between at least one graphical primitive object in the first one of the views with the second one of the views.

9. A computer-implemented method for processing a two-dimensional file comprised of a plurality of components formatted to represent a two-dimensional drawing, the method comprising:
   receiving a two-dimensional file comprising a plurality of two-dimensional drawing objects wherein receiving the two-dimensional file comprises receiving a first file and reformatting the first file into a generic file format, and wherein the generic format comprises a generic data structure describing the components representing the two-dimensional drawing;
   analyzing the contents of said reformatted two-dimensional file, wherein analyzing comprises identifying a plurality of different views in association with an object represented in the two-dimensional file and correlating a first drawing object in a first one of the views with a second drawing object in a second one of the views;
   generating data associating the first and the second drawing objects; and
   storing a drawing file comprising the data associating the first and the second drawing objects.

10. The computer-implemented method of claim 9 further comprising:
    determining an association between one of the plurality of two-dimensional drawing objects and a group; and
    when the group is not a special group, removing the one of the plurality of two-dimensional drawing objects from the group.

11. The computer-implemented method of claim 10 wherein the special group is of a type selected from the set consisting of a dimension group, a leader group, a cross-hatch group, and a block reference group.

12. The computer-implemented method of claim 9 wherein one of the plurality of two-dimensional drawing objects represents one of a dimension indicator, a line, a circle, an ellipse, a square, and a rectangle.

13. The computer-implemented method of claim 9 wherein the two-dimensional file comprises a file generated by a computer drafting software application.

14. The computer-implemented method of claim 9 wherein associating the first and the second drawing objects comprises associating the first drawing object with a view comprising the second drawing object.

15. The computer-implemented method of claim 9 wherein a descriptor in the generic data structure associates the object with the view.

16. The computer-implemented method of claim 9 further comprising inserting link data.

17. A computer program, residing on a computer-readable medium, comprising instructions for causing a computer to:

receive a two-dimensional file comprising a plurality of two-dimensional drawing objects;

analyze the contents of the drawing file, wherein the instructions to analyze comprise instructions to identify a plurality of different views of an object represented in the two-dimensional file and correlate a first drawing object in a first one of the views with a second drawing object in a second one of the views;

generate data associating the first and the second drawing objects; and store a drawing file comprising the data associating the first and the second drawing objects;

wherein the instructions to receive the two-dimensional file comprise instructions to receive a first file and reformat the first file into a generic file format comprising a generic data structure describing the plurality of two-dimensional drawing objects.

\* \* \* \* \*

UNITED STATES PATENT AND TRADEMARK OFFICE
CERTIFICATE OF CORRECTION

PATENT NO. : 6,603,486 B1
DATED : August 5, 2003
INVENTOR(S) : Ilya Baran et al.

It is certified that error appears in the above-identified patent and that said Letters Patent is hereby corrected as shown below:

The title page should be deleted to appear as per attached title page.

The sheets of drawings consisting of figures 1, 2, 3, 5, 8, 11, 12 14-20 and 23, 24 and 26 should be deleted to appear as per attached figures.

Signed and Sealed this

Seventeenth Day of February, 2004

JON W. DUDAS
*Acting Director of the United States Patent and Trademark Office*

(12) United States Patent
Baran et al.

(10) Patent No.: US 6,603,486 B1
(45) Date of Patent: Aug. 5, 2003

(54) ELECTRONIC DRAWING DATA TRANSLATION

(75) Inventors: Ilya Baran, Newton, MA (US); Christopher Ryan, Windham, NH (US); Ricardo Chin, Shrewsbury, MA (US)

(73) Assignee: SolidWorks Corporation, Concord, MA (US)

(*) Notice: Subject to any disclaimer, the term of this patent is extended or adjusted under 35 U.S.C. 154(b) by 0 days.

(21) Appl. No.: 09/449,137

(22) Filed: Nov. 24, 1999

Related U.S. Application Data

(63) Continuation-in-part of application No. 09/394,824, filed on Sep. 13, 1999.

(51) Int. Cl.[7] ............................................... G09G 5/00
(52) U.S. Cl. ..................... 345/672; 345/440; 345/619; 345/629; 345/441
(58) Field of Search ................................. 345/427, 440, 345/636, 629, 441, 419, 672, 673, 680, 443, 619

(56) References Cited

U.S. PATENT DOCUMENTS 5,297,241 A * 3/1994 Hirr, Jr. et al.
5,701,403 A * 12/1997 Watanabe et al.
5,808,616 A * 9/1998 Shimizu ..................... 345/419
5,852,442 A * 12/1998 Morito
5,912,674 A * 6/1999 Magarshak
5,990,897 A * 11/1999 Hanratty ..................... 345/420

OTHER PUBLICATIONS

Foley, VanDam, Feiner, Hughes, "Computer Graphics Principles and Practice", Addison–Wesley, NY, NY, Ch. 5.
Maron, Ran, "Graham's Scan Algorithm for Finding the Convex Hull", Ran Maron's web site, <http://www.math.tau.ac.il/~maron/ex2/ex2.html>, Jun. 2000.

* cited by examiner

Primary Examiner—Mark Zimmerman
Assistant Examiner—Kimbinh T. Nguyen
(74) Attorney, Agent, or Firm—James V. Mahon; Clifford Chance US LLP

(57) ABSTRACT

Processing data objects of a two-dimensional drawing includes marking data objects corresponding to annotation, separating the drawing into a plurality of views, and associating each of the data objects corresponding to annotation with one of the views. Separating the drawing into a plurality of views may include constructing a plurality of intersection and proximity graphs and using the graphs to provide a plurality of connected sets, where each set may correspond to one of the views. The border views may be identified by determining which of the views include less than a predetermined number of elements, contain at least two other views, and are not contained in other views.

17 Claims, 29 Drawing Sheets